(12) United States Patent
Chan et al.

(10) Patent No.: US 9,299,857 B2
(45) Date of Patent: Mar. 29, 2016

(54) SEMICONDUCTOR DEVICE

(71) Applicant: Macronix International Co., Ltd., Hsinchu (TW)

(72) Inventors: Wing-Chor Chan, Hsinchu (TW); Ying-Chieh Tsai, Chiayi (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/309,731

(22) Filed: Jun. 19, 2014

(65) Prior Publication Data

US 2015/0372152 A1     Dec. 24, 2015

(51) Int. Cl.
| | |
|---|---|
| *H01L 29/66* | (2006.01) |
| *H01L 29/808* | (2006.01) |
| *H02M 3/335* | (2006.01) |
| *H01L 29/06* | (2006.01) |

(52) U.S. Cl.
CPC ......... *H01L 29/808* (2013.01); *H02M 3/33507* (2013.01); *H01L 29/0692* (2013.01)

(58) Field of Classification Search
CPC .............. H01L 29/0692; H01L 29/404; H01L 29/66901; H01L 29/808; H01L 29/66893; H01L 29/42316; H01L 29/1066; H01L 27/088; H01L 27/098; H03K 17/223
USPC ......... 257/270, 256, 285, 260, 280, 335, 338; 438/188, 149, 197, 200
See application file for complete search history.

(56) References Cited

U.S. PATENT DOCUMENTS

| | | | | |
|---|---|---|---|---|
| 4,700,461 | A * | 10/1987 | Choi ................... | H01L 21/033 257/E21.033 |
| 5,324,978 | A * | 6/1994 | Ludikhuize ......... | H01L 29/0619 257/271 |
| 6,153,453 | A * | 11/2000 | Jimenez ............... | H01L 27/085 257/133 |
| 2002/0132406 | A1* | 9/2002 | Disney ............ | H01L 21/823412 438/197 |
| 2002/0185696 | A1* | 12/2002 | Beasom .............. | H01L 29/0634 257/409 |
| 2003/0168704 | A1* | 9/2003 | Harada ............... | H01L 29/0623 257/368 |
| 2006/0071247 | A1* | 4/2006 | Chen ................... | H01L 29/1066 257/272 |
| 2007/0120187 | A1* | 5/2007 | Udrea ................. | H01L 29/0653 257/347 |
| 2008/0237704 | A1* | 10/2008 | Williams ............. | H01L 21/761 257/338 |
| 2009/0179268 | A1* | 7/2009 | Abou-Khalil ....... | H01L 27/1203 257/347 |

(Continued)

*Primary Examiner* — Mohammed Shamsuzzaman
(74) *Attorney, Agent, or Firm* — Finnegan, Henderson, Farabow, Garrett & Dunner LLP

(57) ABSTRACT

A semiconductor device includes a substrate having a first conductivity type, a first heavily-doped region formed in the substrate and having the first conductivity type, a second heavily-doped region formed in the substrate and having the first conductivity type, and an embedded layer formed in the substrate and separated from the first and second heavily-doped regions. The embedded layer has a second conductivity type different from the first conductivity type. A portion of the embedded layer is beneath the first heavily-doped region. A third heavily-doped region is formed in the substrate, between the first and second heavily-doped regions, and contacting the embedded layer, and has the second conductivity type.

9 Claims, 23 Drawing Sheets

(56) References Cited

U.S. PATENT DOCUMENTS

| | | | | |
|---|---|---|---|---|
| 2009/0206375 A1* | 8/2009 | Saha | H01L 29/808 | 257/281 |
| 2010/0032731 A1* | 2/2010 | Babcock | H01L 27/095 | 257/280 |
| 2012/0104492 A1* | 5/2012 | Chu | H01L 29/0634 | 257/335 |
| 2012/0142149 A1* | 6/2012 | Tsuchiko | E04B 2/94 | 438/188 |
| 2013/0099293 A1* | 4/2013 | Chen | H01L 29/66901 | 257/260 |
| 2013/0265102 A1* | 10/2013 | Lin | H01L 29/808 | 327/530 |
| 2013/0277718 A1* | 10/2013 | Chan | H01L 29/42316 | 257/280 |
| 2013/0313617 A1* | 11/2013 | Yeh | H01L 29/404 | 257/256ke |
| 2014/0062524 A1* | 3/2014 | Hu | H01L 29/41725 | 324/762.09 |
| 2014/0159110 A1* | 6/2014 | Tsai | H01L 29/7393 | 257/141 |
| 2014/0197467 A1* | 7/2014 | Hsu | H01L 21/76 | 257/272 |
| 2014/0231884 A1* | 8/2014 | Yeh | H01L 29/404 | 257/285 |
| 2014/0253224 A1* | 9/2014 | Chan | H01L 29/66477 | 327/535 |
| 2015/0035587 A1* | 2/2015 | Tsai | H01L 29/7393 | 327/438 |
| 2015/0137192 A1* | 5/2015 | Han | H01L 29/402 | 257/285 |

\* cited by examiner

SEMICONDUCTOR DEVICE

TECHNOLOGY FIELD

The disclosure relates to a semiconductor device and, more particularly, to a high-voltage junction gate field-effect transistor (HV JFET).

BACKGROUND

High voltage processes have been widely used in power management integrated circuits (PMIC's) and switch mode power supplies (SMPS's). For example, an SMPS has a high-voltage start-up circuit that operates with a high input voltage, such as a voltage in a range of about 40 V to about 600 V. In particular, recently, green power is more desired in various types of applications. Green power requires a higher conversion efficiency and a lower standby power consumption. To satisfy such requirements, a high-voltage junction-gate field-effect transistor (HV JFET) is usually used in the high-voltage start-up section of a circuit, such as a switch mode power IC.

An HV JFET usually includes a deep N-type well (deep NWell, an N-type well that has a relatively large depth as compared to a conventional JFET) or a high-voltage N-type well (HV NWell, an N-type well that has a relatively low doping level as compared to a conventional JFET) to serve as a channel between a source and a drain. However, since the doping level in an HV NWell is relatively low, variations during a process for making the HV JFET using an HV NWell can significantly affect a pinch-off voltage of the HV JFET. For example, the pinch-off voltage of the HV JFET may shift by about 25% due to variations in a well implantation step or a dopant drive-in step.

SUMMARY

In accordance with the disclosure, there is provided a semiconductor device including a substrate having a first conductivity type, a first heavily-doped region formed in the substrate and having the first conductivity type, a second heavily-doped region formed in the substrate and having the first conductivity type, and an embedded layer formed in the substrate and separated from the first and second heavily-doped regions. The embedded layer has a second conductivity type different from the first conductivity type. A portion of the embedded layer is beneath the first heavily-doped region. The semiconductor device further includes a third heavily-doped region formed in the substrate, between the first and second heavily-doped regions, and contacting the embedded layer, the third heavily-doped region having the second conductivity type.

Also in accordance with the disclosure, there is provided a semiconductor device including a substrate having a first conductivity type; a well formed in the substrate and having a second conductivity type different from the first conductivity type, a first heavily-doped region and a second heavily-doped region formed in the well and having the second conductivity type, and an embedded layer formed in the well and separated from the first and second heavily-doped regions. The embedded layer has the first conductivity type. A portion of the embedded layer is beneath the first heavily-doped region. The semiconductor device further includes a third heavily-doped region formed in the well, between the first and second heavily-doped regions, and contacting the embedded layer, the third heavily-doped region having the first conductivity type.

Also in accordance with the disclosure, there is provided a switch mode power supply including a high-voltage (HV) start-up circuit, a pulse width modulation circuit, and a capacitor. An output terminal of the HV start-up circuit, an input terminal of the pulse width modulation circuit, and an electrode of the capacitor are coupled to each other. The HV start-up circuit has a HV semiconductor device, which include a substrate having a first conductivity type, a first heavily-doped region formed in the substrate and having the first conductivity type, a second heavily-doped region formed in the substrate and having the first conductivity type, and an embedded layer formed in the substrate and separated from the first and second heavily-doped regions. The embedded layer has a second conductivity type different from the first conductivity type. A portion of the embedded layer is beneath the first heavily-doped region. The HV semiconductor device further includes a third heavily-doped region formed in the substrate, between the first and second heavily-doped regions, and contacting the embedded layer, the third heavily-doped region having the second conductivity type.

Features and advantages consistent with the disclosure will be set forth in part in the description which follows, and in part will be obvious from the description, or may be learned by practice of the disclosure. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Embodiments consistent with the disclosure include a high-voltage junction-gate field-effect transistor (HV JFET).

Hereinafter, embodiments consistent with the disclosure will be described with reference to the drawings. Wherever possible, the same reference numbers will be used throughout the drawings to refer to the same or like parts.

Figure 1A:
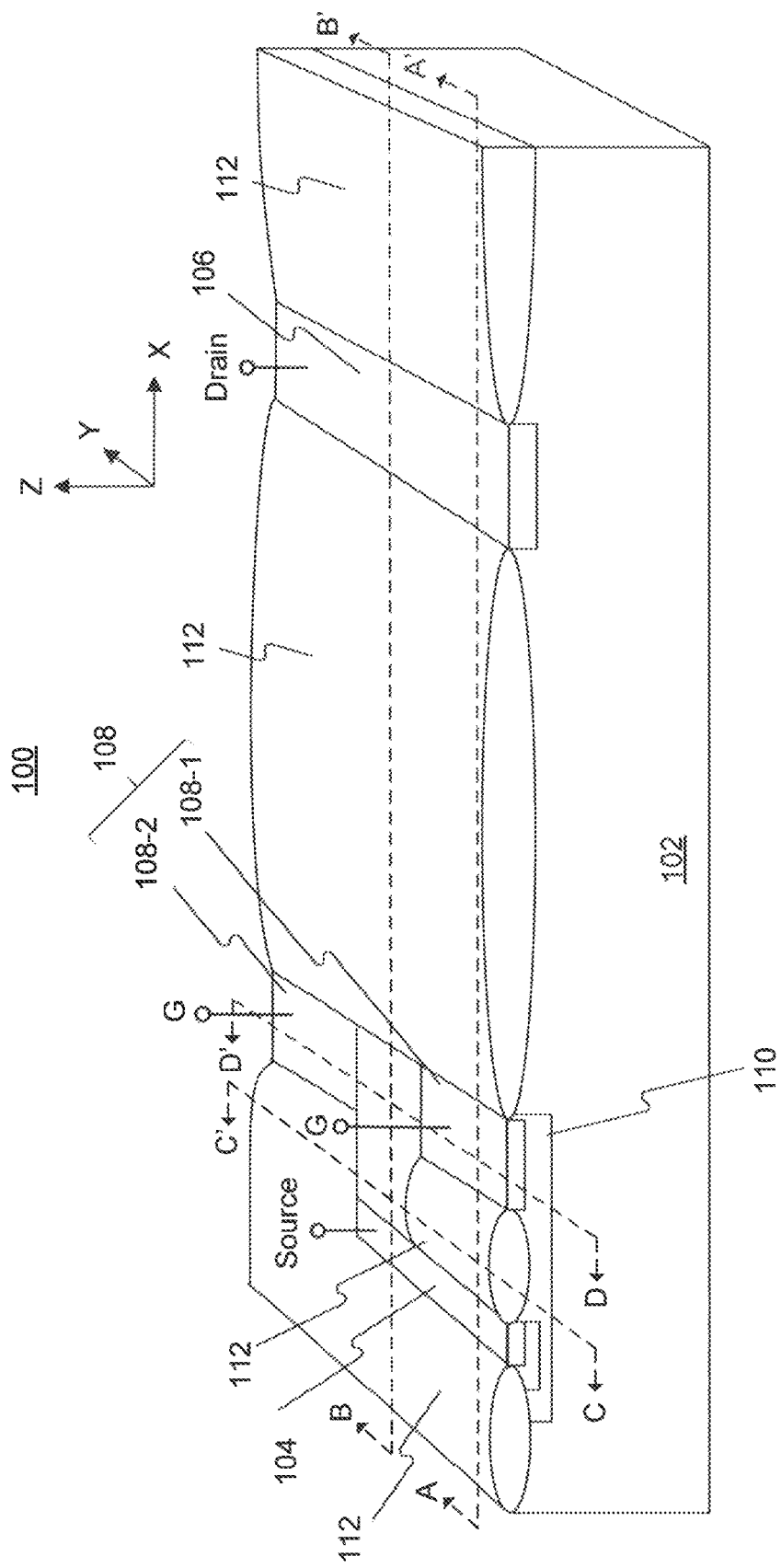
FIGS. 1A-1E schematically show a high-voltage junction-gate field-effect transistor (HV JFET) according to an exemplary embodiment.
Figure 1B:
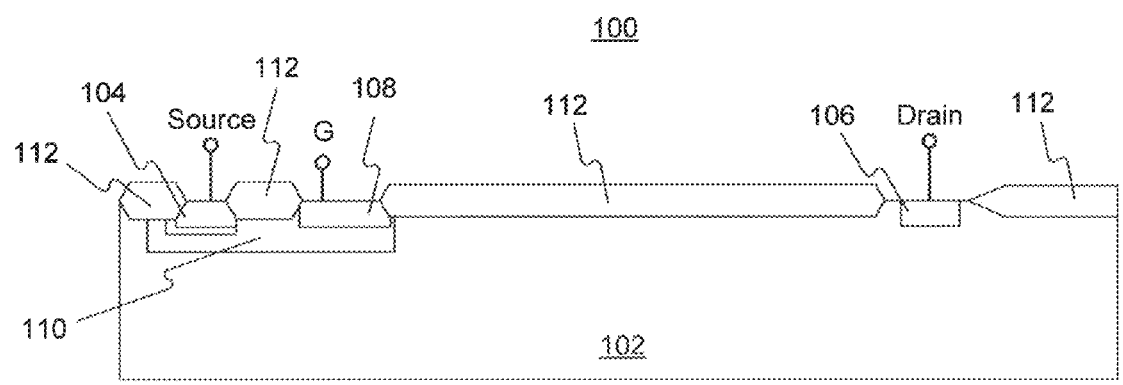
Figure 1C:
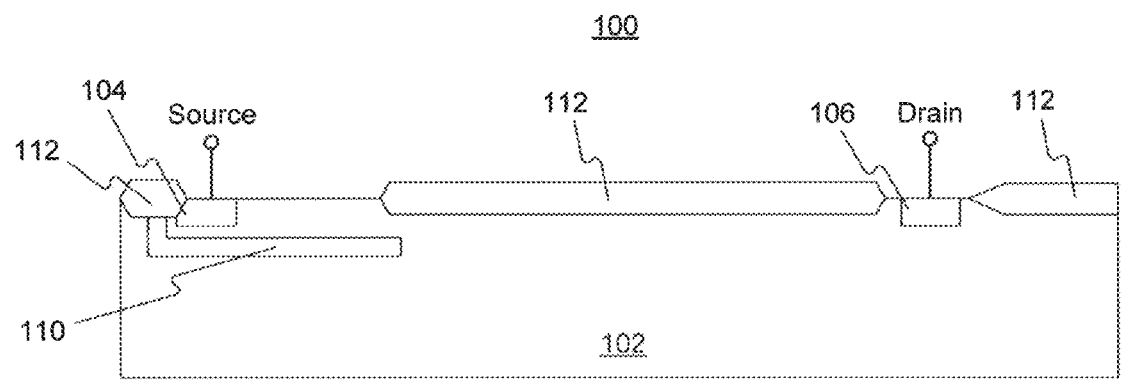
Figure 1D:
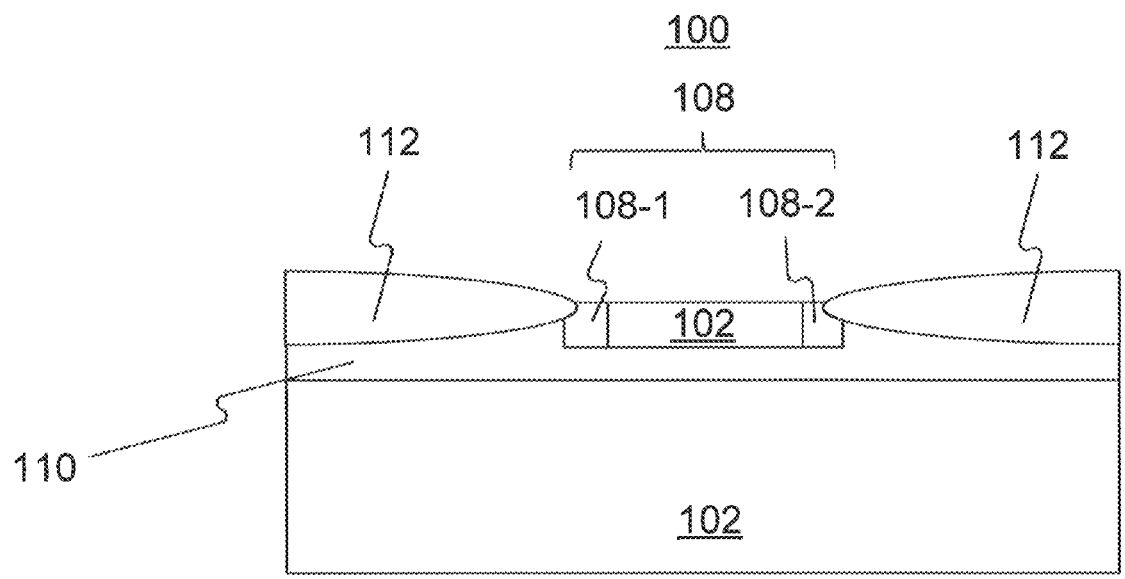
Figure 1E:
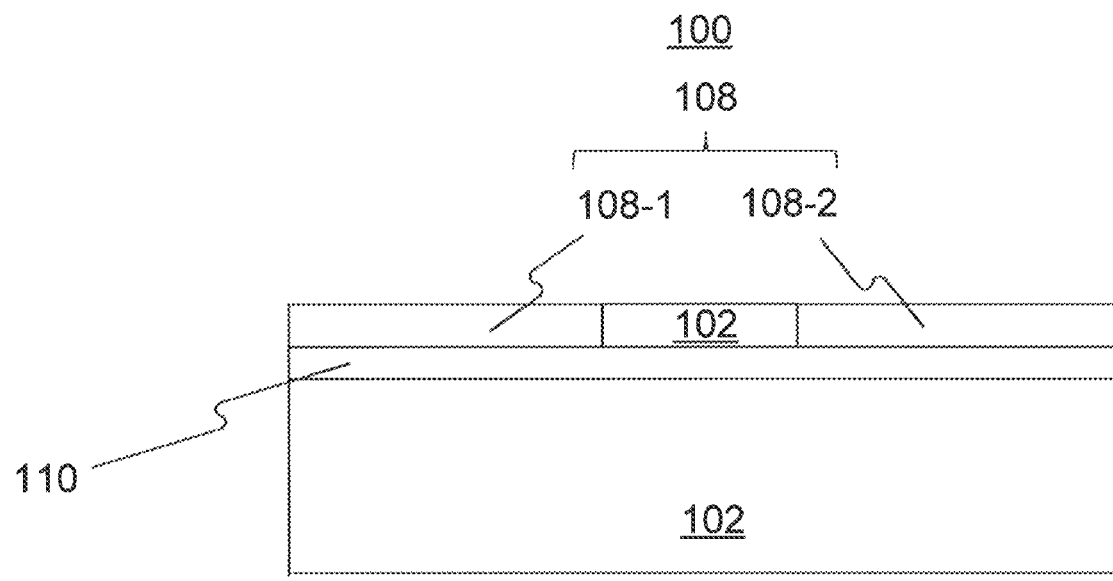

FIGS. 1A-1E schematically show an exemplary HV JFET 100 consistent with embodiments of the disclosure. FIG. 1A is a perspective view of the HV JFET 100, with coordinate system X-Y-Z shown in the figure. FIGS. 1B and 1C are cross-sectional views of the HV JFET 100 along lines A-A' and B-B', extending along the X direction, in FIG. 1A, respectively. FIGS. 1D and 1E are cross-sectional views of the HV JFET 100 along lines C-C' and D-D°, extending along the Y direction, in FIG. 1A, respectively.

The HV JFET 100 includes a substrate 102. In the example shown in FIGS. 1A-1E, the substrate 102 is an N-type substrate. The substrate 102 may be, for example, an N-type silicon substrate or an N-type silicon-on-insulator (SOI) substrate. An impurity concentration, also referred to as a doping level, of the semiconductor substrate 102 is about $8\times10^{13}$ $cm^{-3}$ to about $8\times10^{14}$ $cm^{-3}$. The HV JFET 100 also includes a heavily-doped N-type region (referred to herein as an N$^+$ region) 104, another N$^+$ region 106, and a heavily-doped P-type region (referred to herein as a P$^+$ region) 108. The N$^+$ regions 104 and 106 serve as a source and a drain, respectively, of the HV JFET 100. The P$^+$ region 108 serves as a gate of the HV JFET 100. The impurity concentrations of the N$^+$ regions 104 and 106 may be approximately the same as each other, or may be different from each other, and are higher than the impurity concentration of the substrate 102. In some embodiments, the impurity concentrations of the N$^+$ regions 104 and 106 are about $8\times10^{16}$ $cm^{-3}$ about $8\times10^{18}$ $cm^{-3}$ and about $8\times10^{16}$ $cm^{-3}$ to about $8\times10^{18}$ $cm^{-3}$, respectively. The impurity concentration of the P$^+$ region 108 is about $8\times10^{16}$ $cm^{-3}$ to about $8\times10^{18}$ $cm^{-3}$. In some embodiments, the N$^+$ regions 104 and 106, and the P$^+$ region 108 are formed by incorporating impurities into the substrate 102 via, for example, thermal diffusion or ion implantation. For the HV JFET 100 shown in FIGS. 1A-1E, or other HV JFET's described in this disclosure, the N-type impurities may include at least one of phosphorus, arsenic, or antimony, and the P-type impurities may include at least one of boron or aluminum.

The HV JFET 100 also includes an embedded P-type layer (referred to herein as embedded P-layer) 110, which may be formed by, for example, implanting P-type impurities into the substrate 102. The impurity concentration of the embedded P-layer 110 is lower than the impurity concentration of the P$^+$ region 108, and is about $4\times10^{14}$ $cm^{-3}$ to about $8\times10^{16}$ $cm^{-3}$.

As shown in FIGS. 1A and 1B, the embedded P-layer 110 contacts, and is electrically coupled with, the P$^+$ region 108, and thus can have applied thereto a voltage by an external voltage source applied to the P$^+$ region 108. The embedded P-layer 110 extends beneath the N$^+$ region 104 in one direction (a left direction in FIGS. 1A, 1B, and 1C, i.e., negative X direction), and extends in another direction (a right direction in FIGS. 1A, 1B, and 1C, i.e., positive X direction) to a point between the P$^+$ region 108 and the N$^+$ region 106. However, at least a portion of the embedded P-layer 110 is separated from a surface of the substrate 102 by a certain distance, as shown in, e.g., FIG. 1C. Therefore, the embedded P-layer 110 essentially functions as a blocking layer. As a consequence, a current to or from the N$^+$ region 104 may be blocked from reaching a deep portion of the substrate 102, and thus be forced to flow along a route close to the surface of the substrate 102, i.e., the surface of the HV JFET device 100.

The P$^+$ region 108 includes two sub-regions, i.e., P$^+$ sub-region 108-1 and P$^+$ sub-region 108-2, as shown FIGS. 1A, 1D, and 1E. The P$^+$ sub-regions 108-1 and 108-2 and the embedded P-layer 110 create a depletion region in an area surrounded by the P$^+$ sub-regions 108-1 and 108-2 and the embedded P-layer 110. An area surrounded by the depletion region constitutes a channel for the current between the N$^+$ regions 104 and 106 (referred to as D-S current). The D-S current is substantially confined in this channel. A cross-sectional size of the depletion region, and consequently a cross-sectional size of the channel, can be adjusted by adjusting the voltage applied to the gate ($V_G$), i.e., the voltage applied to the P$^+$ sub-regions 108-1 and 108-2 and the embedded P-layer 110. When $V_G$ reaches a pinch-off voltage, the channel is turned off and no current flows between the N$^+$ regions 104 and 106.

The HV JFET 100 also includes insulating isolation layers 112, which separate adjacent heavily doped regions from each other, to reduce the possibility of breakdown. Each of the insulating isolation layers 112 may include, for example, one of a field-oxide layer, a shallow-trench isolation layer, or a deep-trench isolation layer.

Figure 2A:
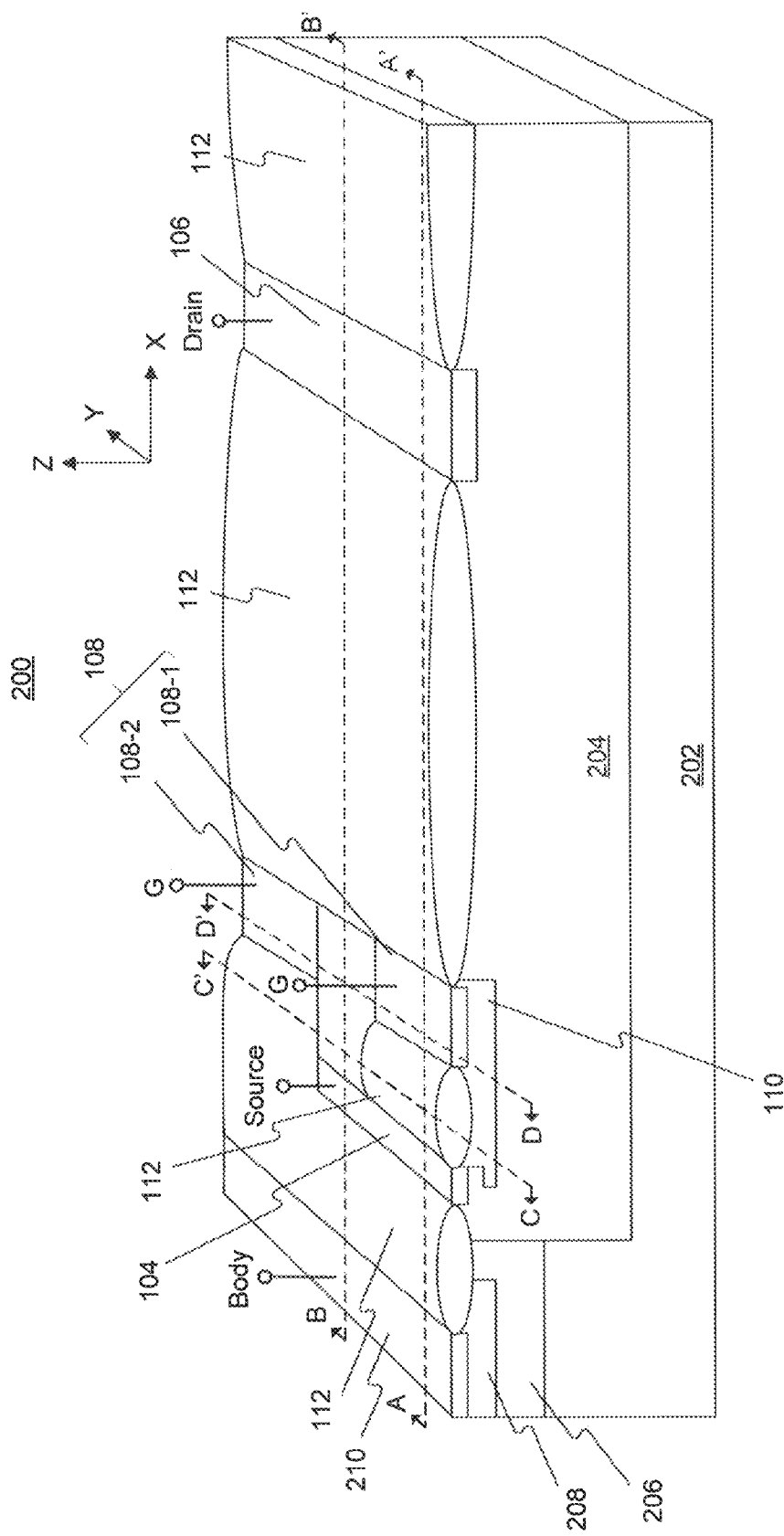
FIGS. 2A-2E schematically show an HV JFET according to an exemplary embodiment.
Figure 2B:
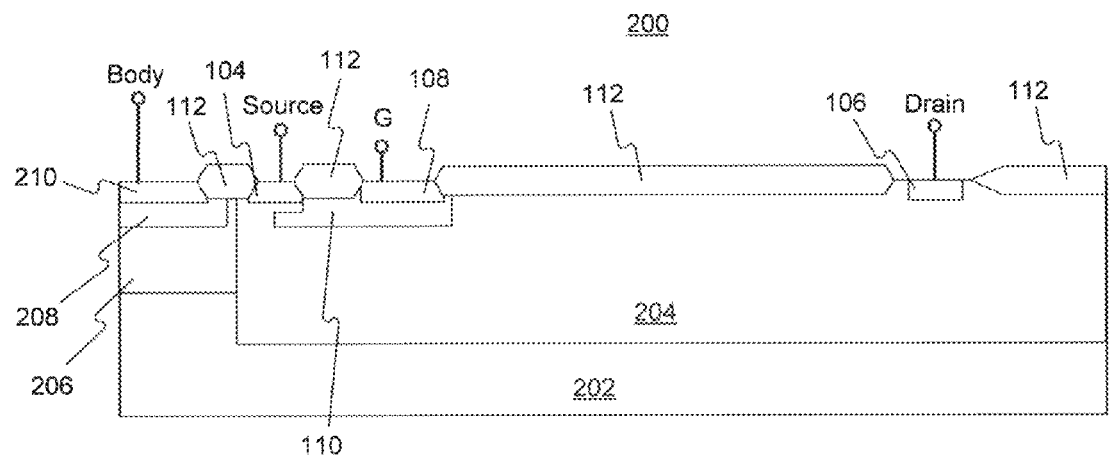
Figure 2C:
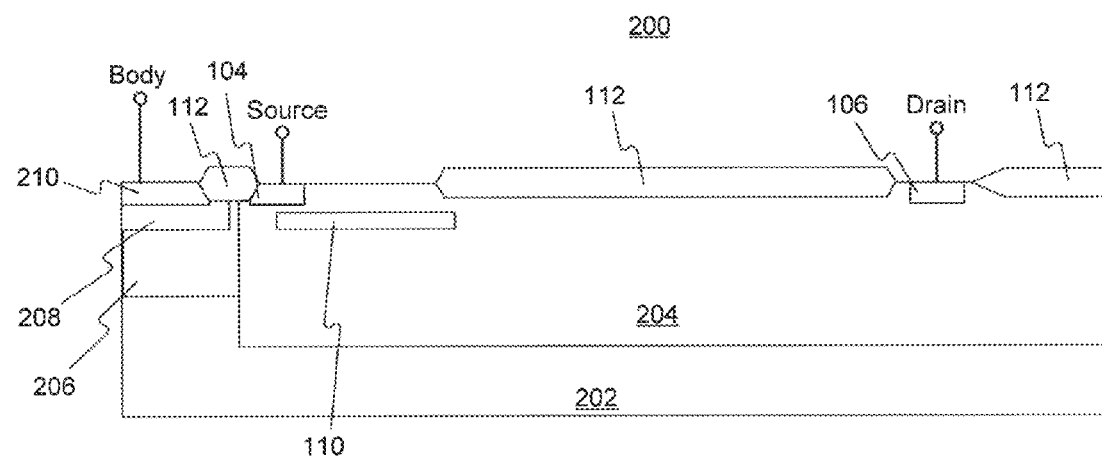
Figure 2D:
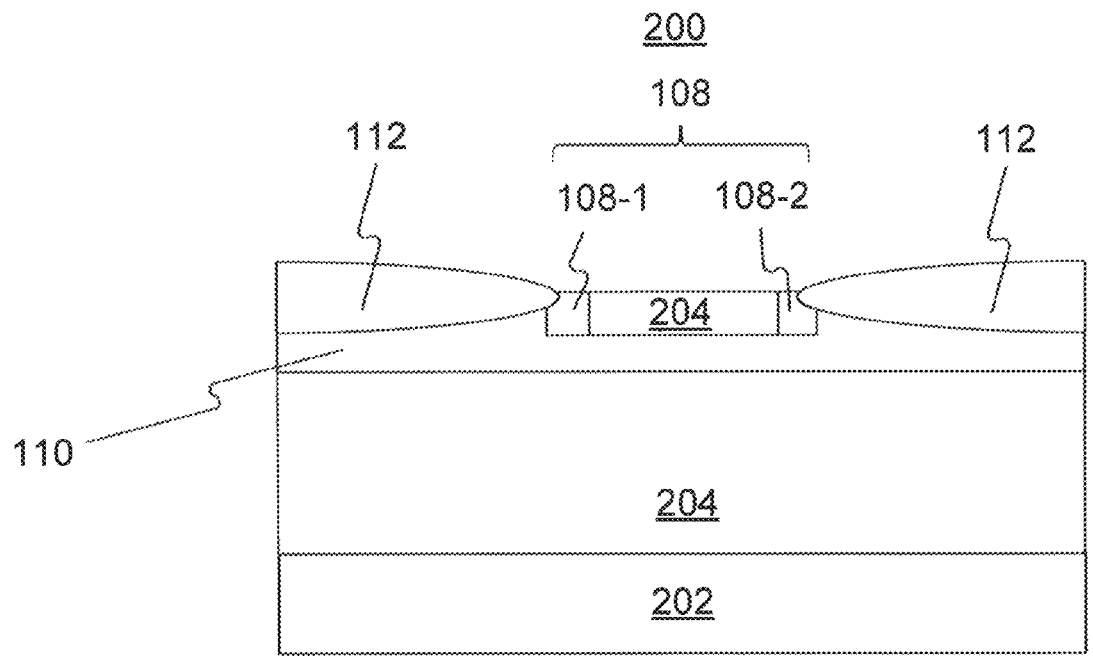
Figure 2E:
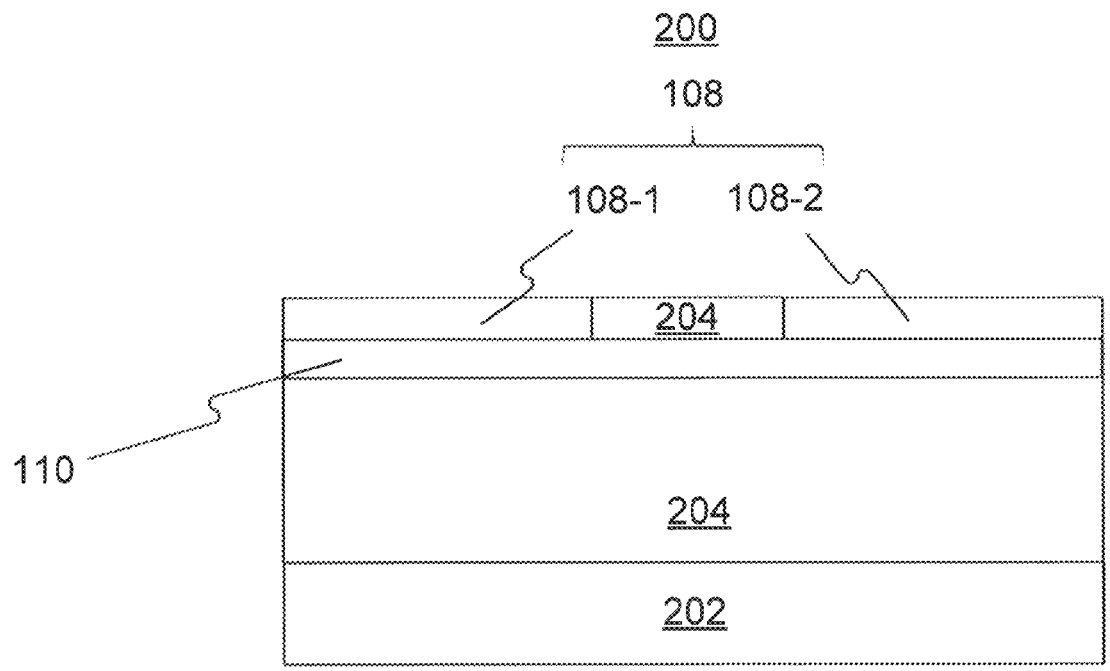

FIGS. 2A-2E schematically show an exemplary HV JFET 200 consistent with embodiments of the disclosure. FIG. 2A is a perspective view of the HV JFET 200. FIGS. 2B and 2C are cross-sectional views of the HV JFET 200 along lines A-A' and B-B' in FIG. 2A, respectively. FIGS. 2D and 2E are cross-sectional views of the HV JFET 200 along lines C-C' and D-D' in FIG. 2A, respectively.

The HV JFET 200 is formed in a P-type substrate 202. The P-type substrate 202 may be a P-type silicon substrate or a P-type SOI substrate. In the HV JFET 200, an N-type well (NWell) 204 is formed in the P-type substrate 202. The N$^+$ regions 104 and 106, the P$^+$ region 108, and the embedded P-layer 110 are formed in the NWell 204. In some embodiments, the NWell 204 is formed by incorporating N-type impurities into the P-type substrate 202 via, for example, thermal diffusion or ion implantation. The impurity concentration of the NWell 204 is lower than the impurity concentrations of the N$^+$ regions 104 and 106, and is about $8\times10^{13}$ $cm^{-3}$ about $8\times10^{16}$ $cm^{-3}$. The impurity concentration of the NWell 204 may be adjusted to control the breakdown voltage of the HV JFET 200. Generally, the lower the impurity concentration of the NWell 204, the higher is the breakdown voltage of the HV JFET 200. However, for an HV JFET having a low impurity concentration of the NWell 204, additional components may be needed to achieve good performance, which requires a more complex fabrication process, as will be described below.

The HV JFET 200 also includes a P-type well (PWell) 206. An embedded P-layer 208 is formed in the PWell 206, and a P$^+$ region 210 is formed on the embedded P-layer 208. The P$^+$ region 210 serves as a body electrode of the HV JFET 200.

As shown in FIGS. 2A-2C, the embedded P-layer 110 may not completely block a current path from the N$^+$ region 104 to the deep portion of the NWell 204. Through the P$^+$ region 210, a voltage can be applied to the embedded P-layer 208 and the PWell 206. That voltage works together with the voltage applied to the P-layer 110 through the P$^+$ region 108 to better pinch off the above-mentioned current path.

Figure 3A:
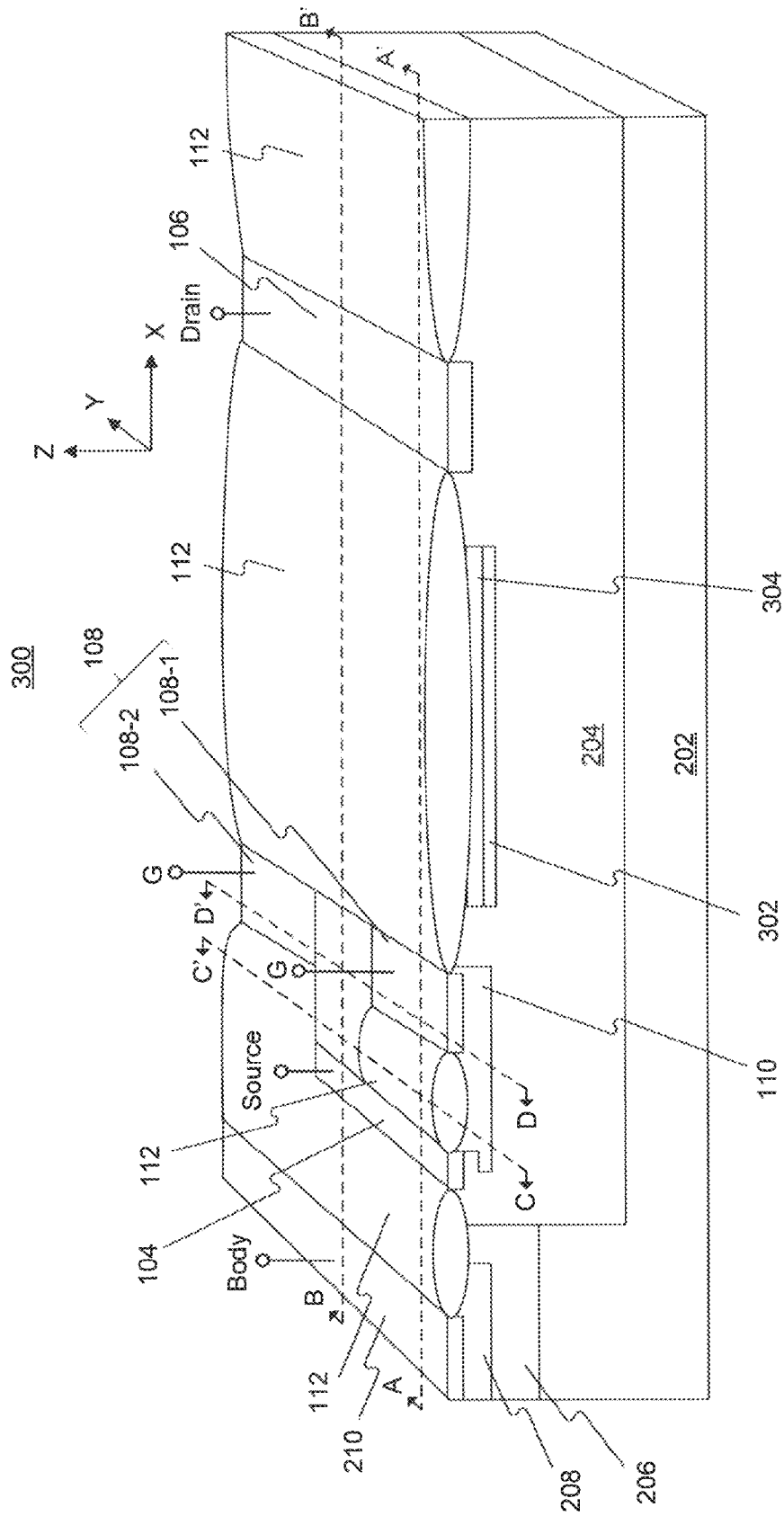
FIGS. 3A-3C schematically show an HV JFET according to an exemplary embodiment.
Figure 3B:
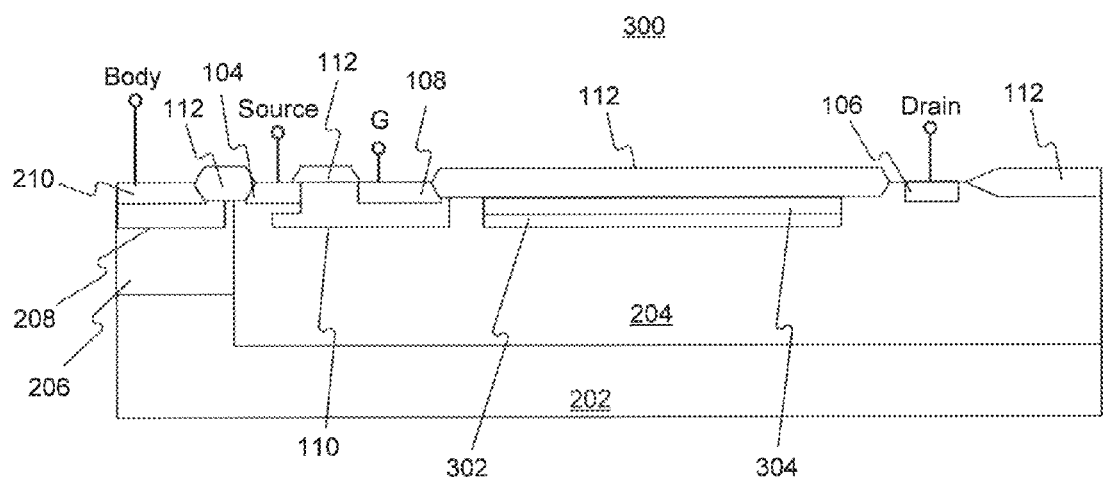
Figure 3C:
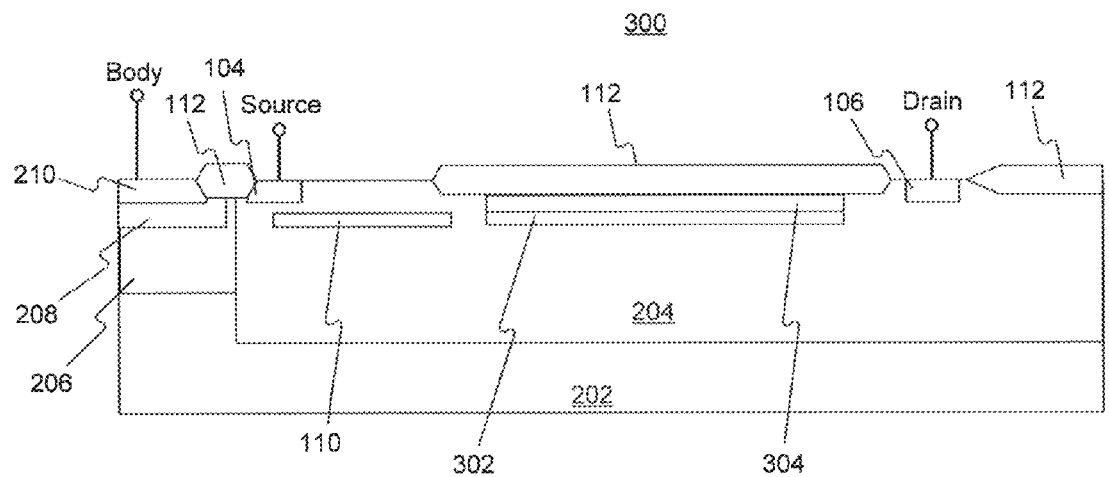

FIGS. 3A-3C schematically show an exemplary HV JFET 300 consistent with embodiments of the disclosure. FIG. 3A is a perspective view of the HV JFET 300. FIGS. 3B and 3C are cross-sectional views of the HV JFET 300 along lines A-A' and B-B' in FIG. 3A, respectively. The cross-sectional views of the HV JFET 300 along lines C-C' and D-D' in FIG. 3A are the same as the cross-sectional views of the HV JFET 200 along lines C-C' and D-D' in FIG. 2A, i.e., the same as the cross-sectional views shown in FIGS. 2D and 2E, and are thus not repeated.

The HV JFET 300 is similar to the HV JFET 200, except that the HV JFET 300 additionally includes an embedded P-layer 302 formed in a region (referred to as drift region) between the P$^+$ region 108 and the N$^+$ region 106, and an N-type layer (N-layer) 304 formed above the embedded P-layer 302. The embedded P-layer 302 is also referred to as P-top layer 302. The P-top layer 302 and the N-layer 304 may be formed by, for example, ion implantation. In some embodiments, the P-top layer 302 is formed in a different step than the embedded P-layers 110 and 208. The impurity concentration of the P-top layer 302 is about $1 \times 10^{14}$ cm$^{-3}$ to about $8 \times 10^{15}$ cm$^{-3}$. The impurity concentration of the N-layer 304 is higher than the impurity concentration of the NWell 204, and is about $2 \times 10^{14}$ cm$^{-3}$ to about $1 \times 10^{16}$ cm$^{-3}$.

The P-top layer 302 does not contact the embedded P-layer 110, and is not electrically connected to any external terminal. That is, the P-top layer 302 is physically and electrically floating.

Consistent with embodiments of the disclosure, the N-layer 304 is relatively thin, for example, about 0.1 μm to about 0.4 μm. Therefore, when a high voltage is applied to the N$^+$ region 106, i.e., the drain of the HV JFET 300, the N-layer 304 is completely depleted by the P-top layer 302 and the NWell 204. Consequently, the N-layer 304 and the P-top layer 302 also define a channel for the D-S current. Since the N-layer 304 has a higher impurity concentration than the NWell 204, current flows more easily through the N-layer 304 than the NWell 204. This further ensures that the D-S current is confined to a region close to the surface, and does not spread to the deep portion of the NWell 204. The channel formed by the N-layer 304 and the P-top layer 302 is useful when the impurity concentration of the NWell 204 is relative low. In such case, the N-layer 304 and the P-top layer 302 help to improve the performance of the HV JFET 300. For example, due to the existence of the N-layer 304 and the P-top layer 302, when a high voltage is applied to the N$^+$ region 106, the N-layer 304 and the P-type layer 302, as well as the NWell 204 are completely depleted, creating a full depletion region. Therefore, a surface electric field is reduced, and the breakdown voltage of the HV JFET 300 is increased as compared to a JFET device without the N-layer 304 and the P-top layer 302.

Figure 4A:
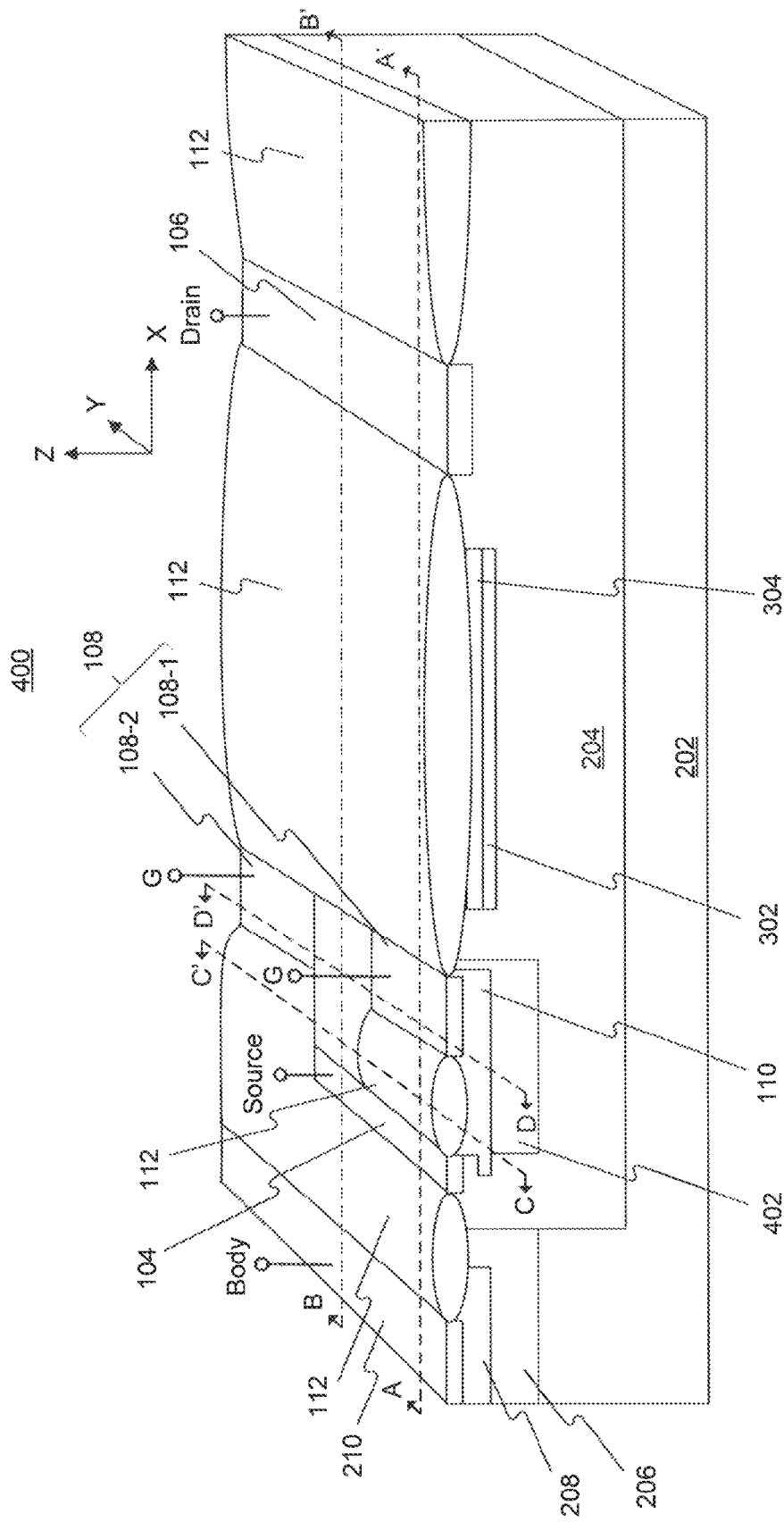
FIGS. 4A-4D schematically show an HV JFET according to an exemplary embodiment.
Figure 4B:
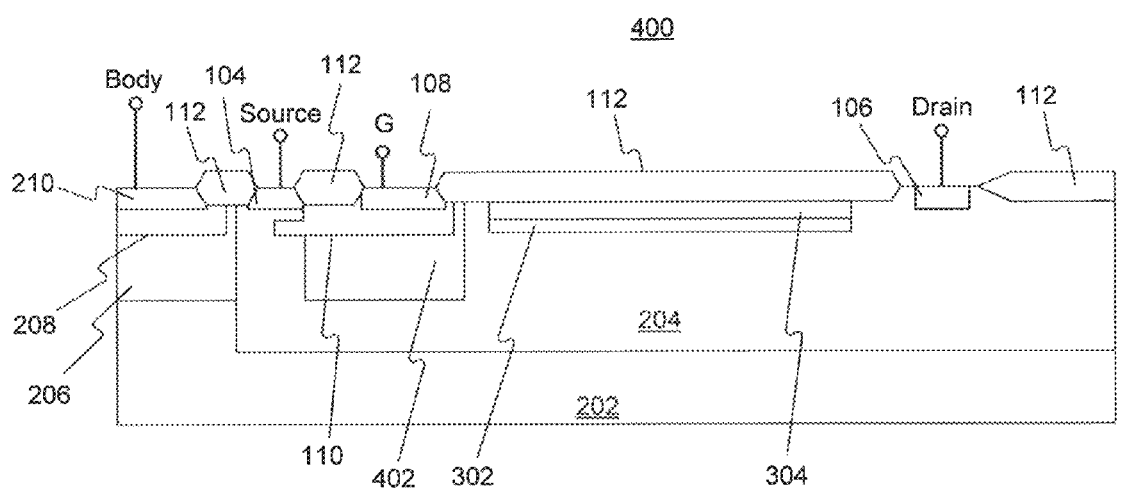
Figure 4C:
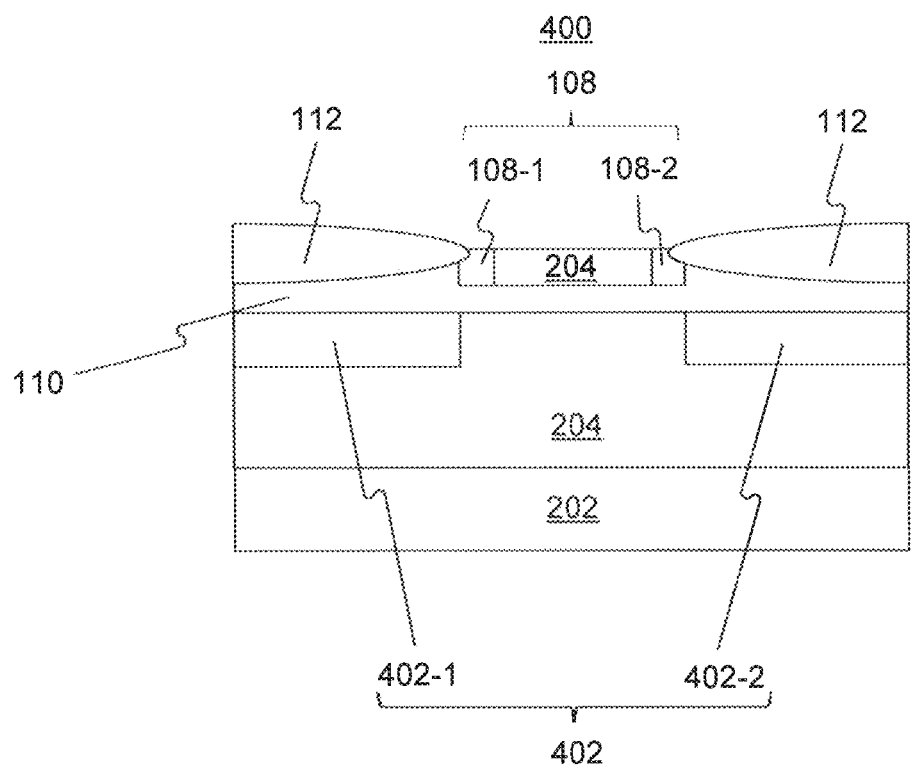
Figure 4D:
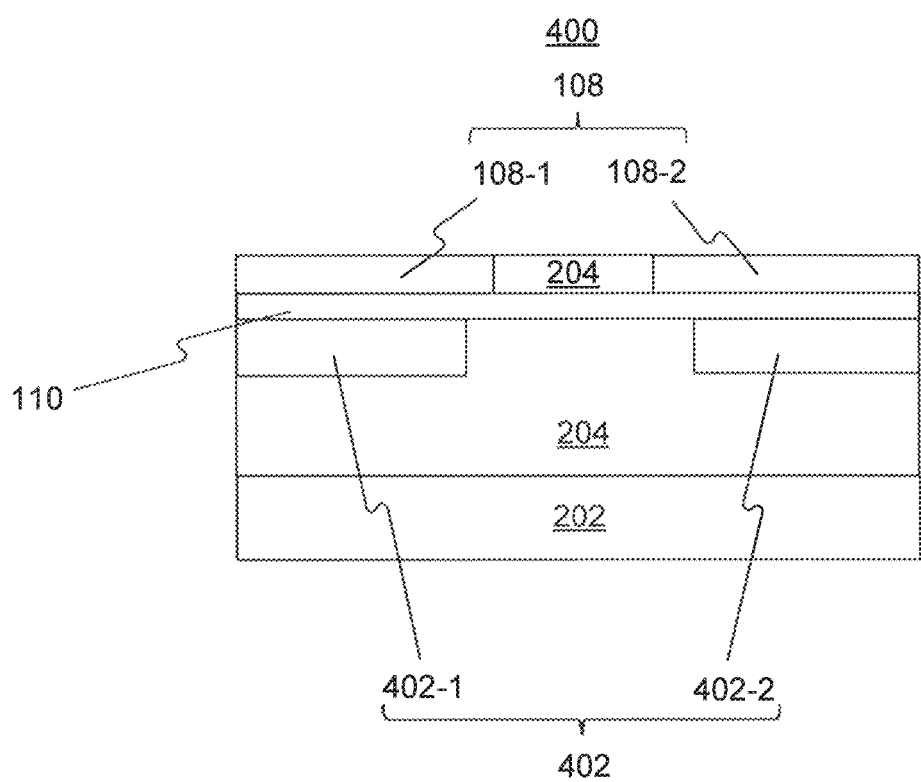

FIGS. 4A-4D schematically show an exemplary HV JFET 400 consistent with embodiments of the disclosure. FIG. 4A is a perspective view of the HV JFET 400. FIG. 4B is a cross-sectional view of the HV JFET 400 along line A-A' in FIG. 4A. FIGS. 4C and 4D are cross-sectional views of the HV JFET 400 along lines C-C' and D-D' in FIG. 4A, respectively. The cross-sectional view of the HV JFET 400 along line B-B' in FIG. 4A is the same as the cross-sectional view of the HV JFET 300 along line B-B' in FIG. 3A, i.e., the same as the cross-sectional view shown in FIG. 3C, and is thus not repeated.

The HV JFET 400 is similar to the HV JFET 300, except that the HV JFET 400 further includes a PWell 402 at locations of the embedded P-layer 110 and the P$^+$ region 108. As shown in FIGS. 4C and 4D, the PWell 402 includes two sub-wells, i.e., sub-PWell 402-1 and sub-PWell 402-2.

In the embodiments discussed above, the embedded P-layer 110 covers a portion of a right side of the N$^+$ region 104, but only extends towards the left, i.e., negative X direction, to a point beneath the N$^+$ region 104. In other embodiments, the embedded P-layer 110 extends towards the left beyond the N$^+$ region 104, and even covers a left side of the N$^+$ region 104. Such an arrangement may further limit the current from the N$^+$ region 104 to reach the deep portion of the substrate 102 in FIGS. 1A-1E or the deep portion of the NWell 204 in other figures.

Figure 5A:
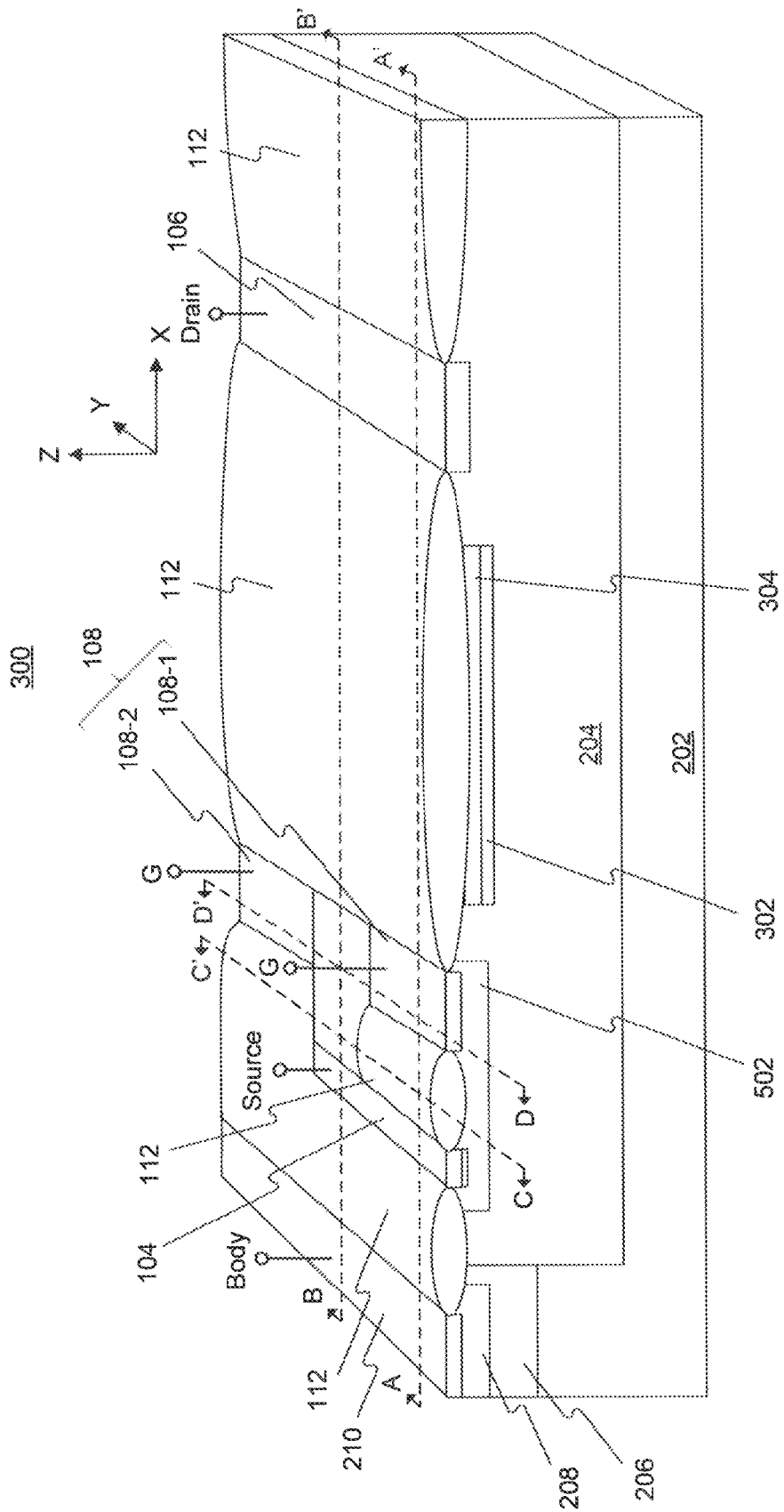
FIGS. 5A-5C schematically show an HV JFET according to an exemplary embodiment.
Figure 5B:
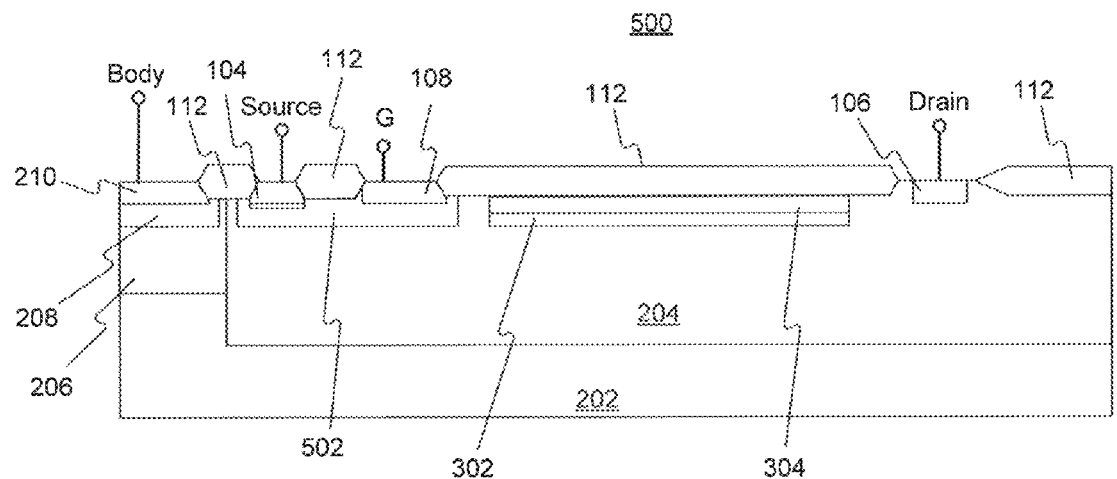
Figure 5C:
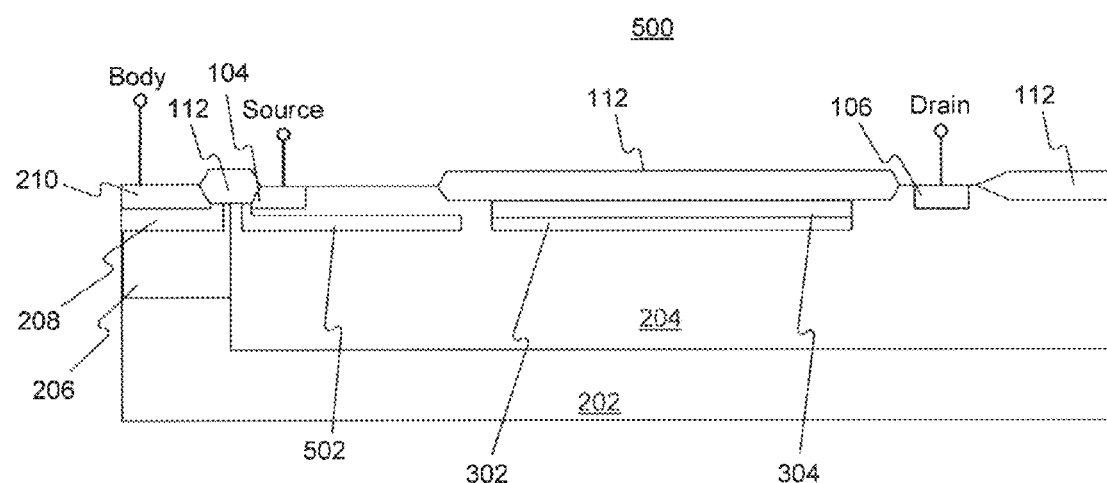

FIGS. 5A-5C schematically show an exemplary HV JFET 500 consistent with embodiments of the disclosure. FIG. 5A is a perspective view of the HV JFET 500. FIGS. 5B and 5C are cross-sectional views of the HV JFET 500 along lines A-A' and B-B' in FIG. 5A, respectively. The cross-sectional views of the HV JFET 500 along lines C-C' and D-D' in FIG. 5A are the same as the cross-sectional views of the HV JFET 300 along lines C-C' and D-D' in FIG. 3A and the same as the cross-sectional views of the HV JFET 200 along lines C-C' and D-D' in FIG. 2A, i.e., the same as the cross-sectional views shown in FIGS. 2D and 2E, and are thus not repeated.

The HV JFET 500 is similar to the HV JFET 300, except that in the HV JFET 500, an embedded P-layer 502 covers the left side and a bottom side of the N$^+$ region 104. In some embodiments, the embedded P-layer 502 completely covers the left side and the bottom side of the N$^+$ region 104.

Figure 6A:
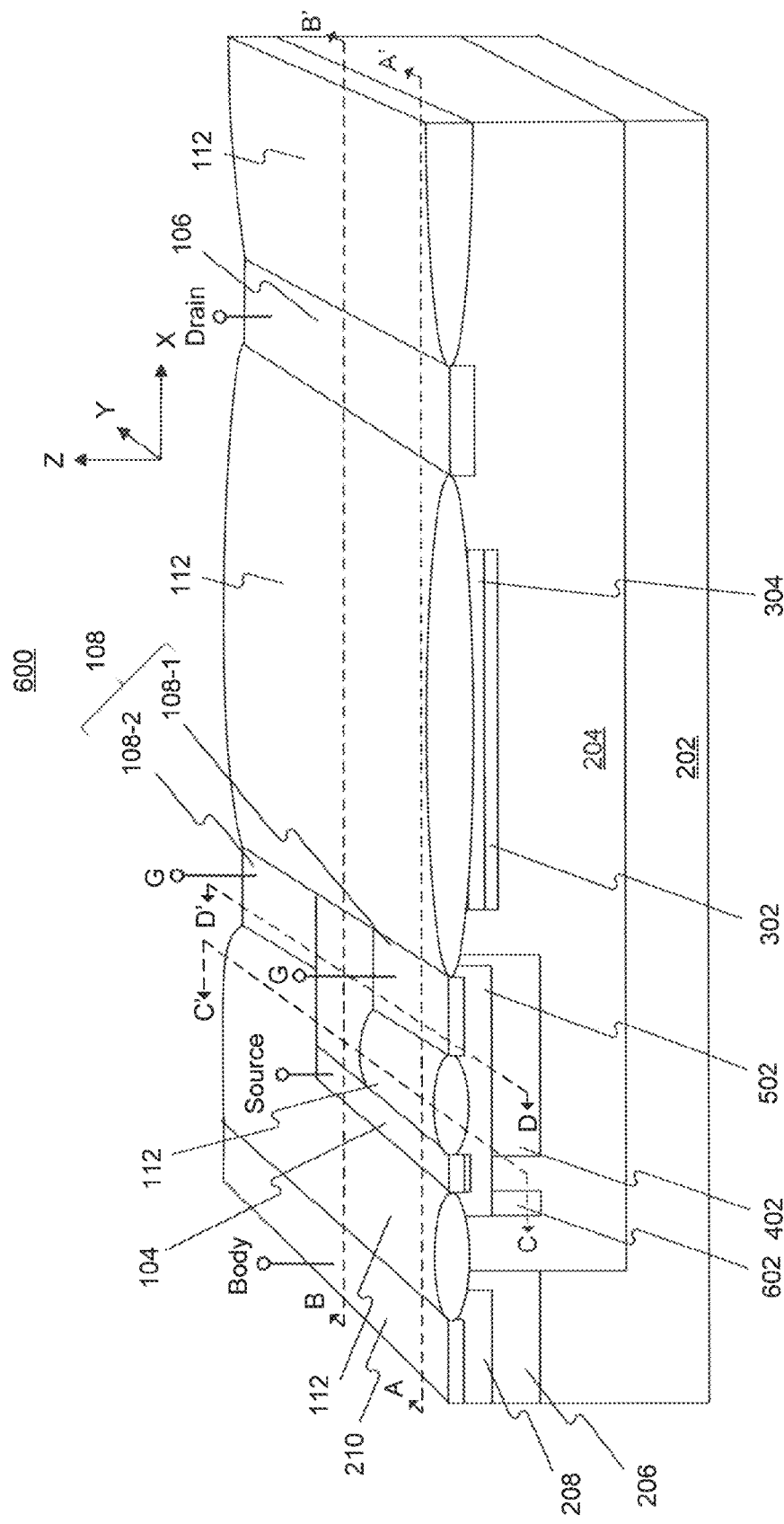
FIGS. 6A and 6B schematically show an HV JFET according to an exemplary embodiment.
Figure 6B:
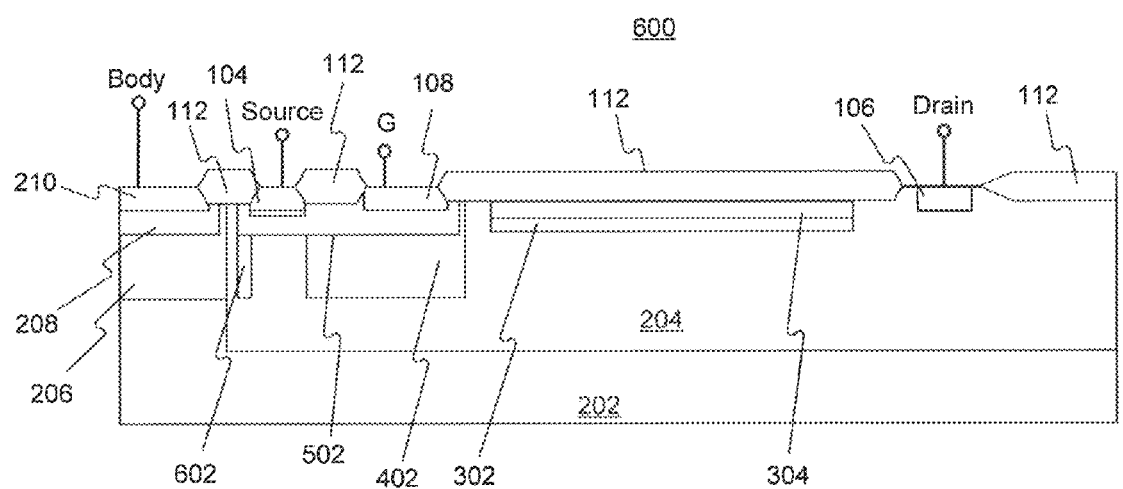

FIGS. 6A and 6B schematically show an exemplary HV JFET 600 consistent with embodiments of the disclosure. FIG. 6A is a perspective view of the HV JFET 600. FIG. 6B is a cross-sectional view of the HV JFET 600 along line A-A' in FIG. 6A. The cross-sectional view of the HV JFET 600 along line B-B' in FIG. 6A is the same as the cross-sectional view of the HV JFET 500 along line B-B' in FIG. 5A, i.e., the same as the cross-sectional view shown in FIG. 5C, and is thus not repeated. The cross-sectional views of the HV JFET 600 along lines C-C' and D-D' in FIG. 6A are the same as the cross-sectional views of the HV JFET 400 along lines C-C' and D-D' in FIG. 4A, i.e., the same as the cross-sectional views shown in FIGS. 4C and 4D, and are thus not repeated.

The HV JFET 600 is similar to the HV JFET 500, except that the HV JFET 600 further includes the PWell 402 and an additional PWell 602. The PWell 602 is formed on the left side of the N$^+$ region 104.

In the embodiments discussed above with respect to FIGS. 2A-6B, the PWell 206, the embedded P-layer 208, and the P$^+$ region 210 are formed in the P-type substrate 202. Optionally, an N-type barrier layer (NBL) and a depleted high-resistance P-type epitaxial (P-Epi) layer may be formed in the P-type substrate 202 to improve isolation in high-voltage applications, as described below in connection with FIG. 7.

Figure 7:
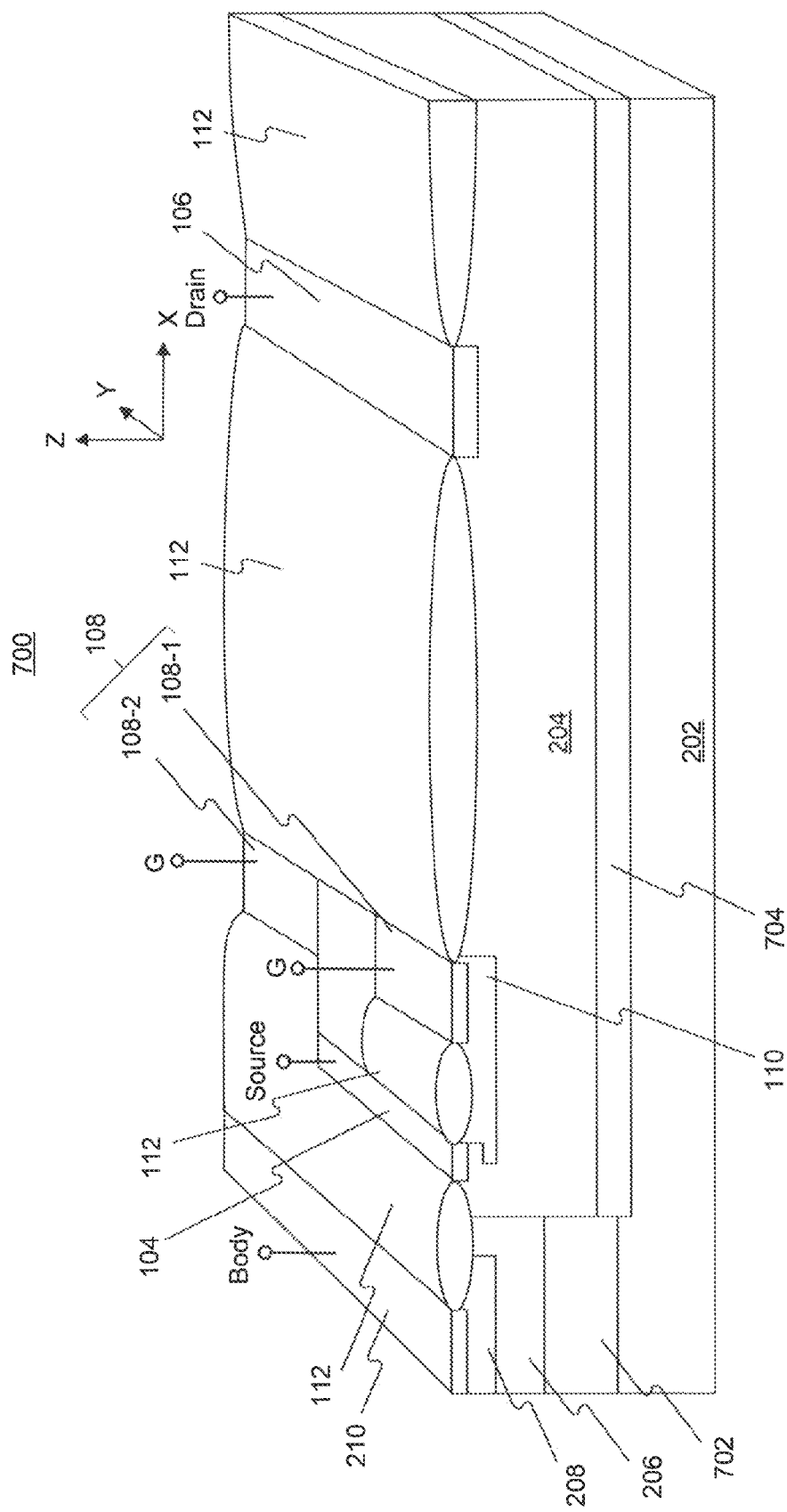
FIG. 7 schematically shows an HV JFET according to an exemplary embodiment.

FIG. 7 schematically shows an exemplary HV JFET 700 consistent with embodiments of the disclosure. The HV JFET 700 is similar to the HV JFET 200 shown in FIG. 2. However, in the HV JFET 700, a P-Epi layer 702 is formed in the P-type substrate 202 using an epitaxy method. The PWell 206, the embedded P-layer 208, and the P$^+$ region 210 are formed in the P-Epi layer 702.

The HV JFET 700 further includes an NBL 704. The impurity concentration of the NBL 704 is about 1.5-2 orders higher than the impurity concentration of the NWell 204. For example, the impurity concentration of the NBL 704 is about $8 \times 10^{15}$ cm$^{-3}$ to about $8 \times 10^{18}$ cm$^{-3}$. The NBL 704 further increases the drain-to-body breakdown voltage of the HV JFET 700.

Figure 8:
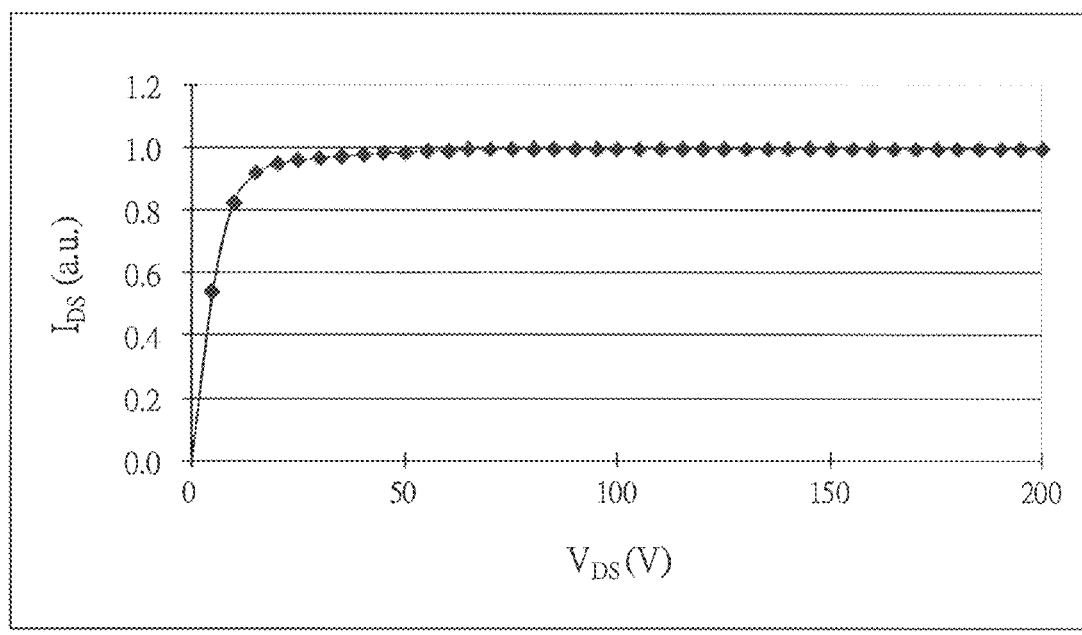
FIG. 8 is a graph schematically showing a relationship between a current flowing between a drain and a source and a voltage applied between the drain and the source for an HV JFET according to an exemplary embodiment.

In an HV JFET consistent with embodiments of the disclosure, such as any one of the HV JFET's described above, the D-S current ($I_{DS}$) is confined to flow near the surface of the device, and is laterally limited. As a consequence, the D-S current is easier to saturate, i.e., the D-S current in the HV JFET consistent with embodiments of the disclosure saturates at a lower $V_{DS}$ (voltage between the drain and the source, i.e., the voltage between the N$^+$ regions 106 and 104) as compared to a conventional HV JFET. Accordingly, a saturation region of an HV JFET consistent with embodiments of the disclosure is wider than the saturation region of a conventional HV JFET. FIG. 8 is a graph showing a relationship between $I_{DS}$ and $V_{DS}$ for an HV JFET consistent with embodiments of the disclosure. It is seen that this HV JFET saturates at a $V_{DS}$ smaller than about 20 V. Generally, an HV JFET consistent with embodiments of the disclosure may have a saturation region from about 15 V to about 600 V, and thus can provide a wide range of operation voltages, i.e., from about 15 V to about 600 V, when being used in a current source circuit.

Figure 9A:
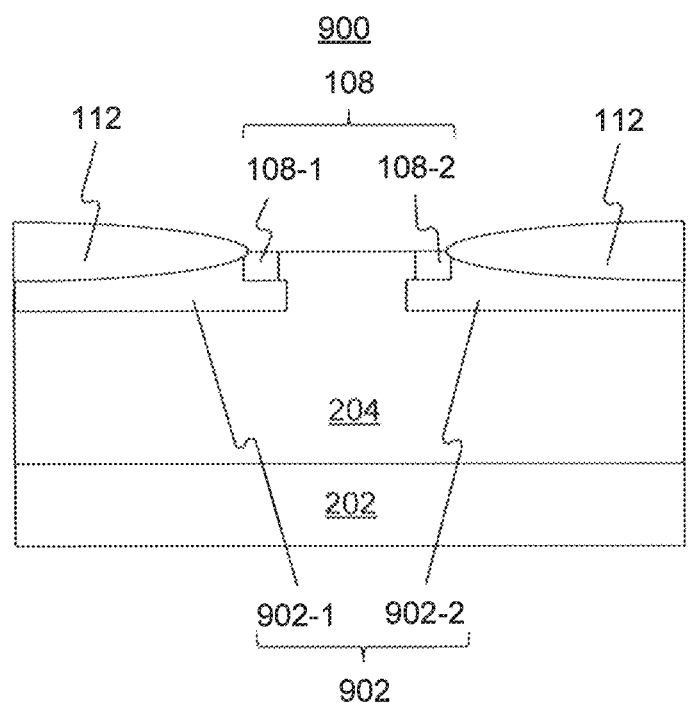
FIGS. 9A and 9B schematically show an HV JFET according to an exemplary embodiment.
Figure 9B:
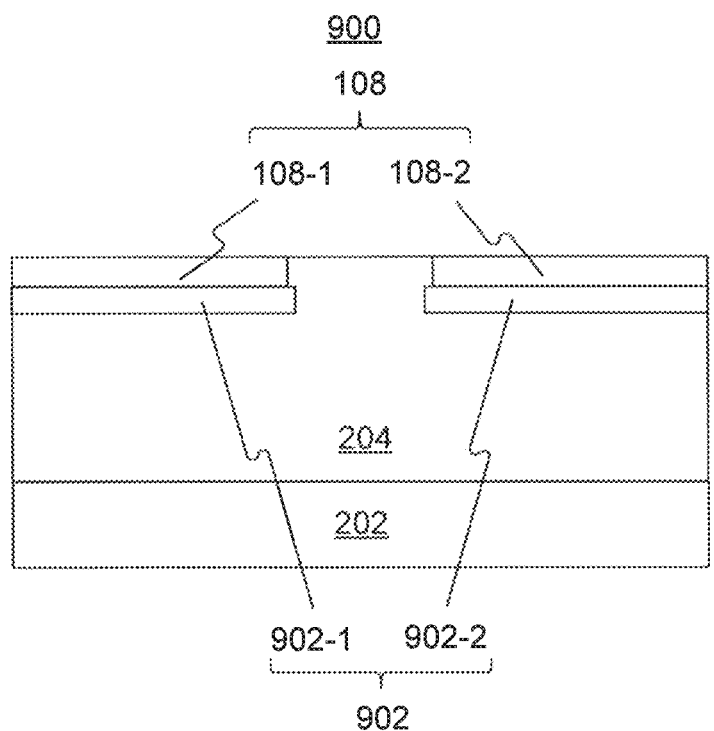

FIGS. 9A and 9B schematically show an HV JFET 900 including consistent with embodiments of the disclosure. The HV JFET 900 includes design features that help to keep the current flow spaced apart from the surface of the device, so as to reduce the impact of surface imperfections on the current flow and thus on the performance of the device. For example, the HV JFET 900 is a modification of the HV JFET 200. The perspective view of the HV JFET 900 is the same as the perspective view of the HV JFET 200 shown in FIG. 2A, and is thus not repeated. Reference will be made to FIG. 2A for the HV JFET 900. FIGS. 9A and 9B are cross-sectional views of the HV JFET 900 along lines C-C' and D-D' in FIG. 2A.

The HV JFET 900 is similar to the HV JFET 200 except that in the HV JFET 900, an embedded P-layer 902 includes two sub-layers—embedded sub-P-layer 902-1 and embedded sub-P-layer 902-2. The embedded sub-P-layers 902-1 and 902-2 are separated from each other by a space beneath a space between the P$^+$ sub-regions 108-1 and 108-2. Due to the space between the embedded sub-P-layers 902-1 and 902-2, the pinch-off voltage of the HV JFET is better controlled.

Figure 10A:
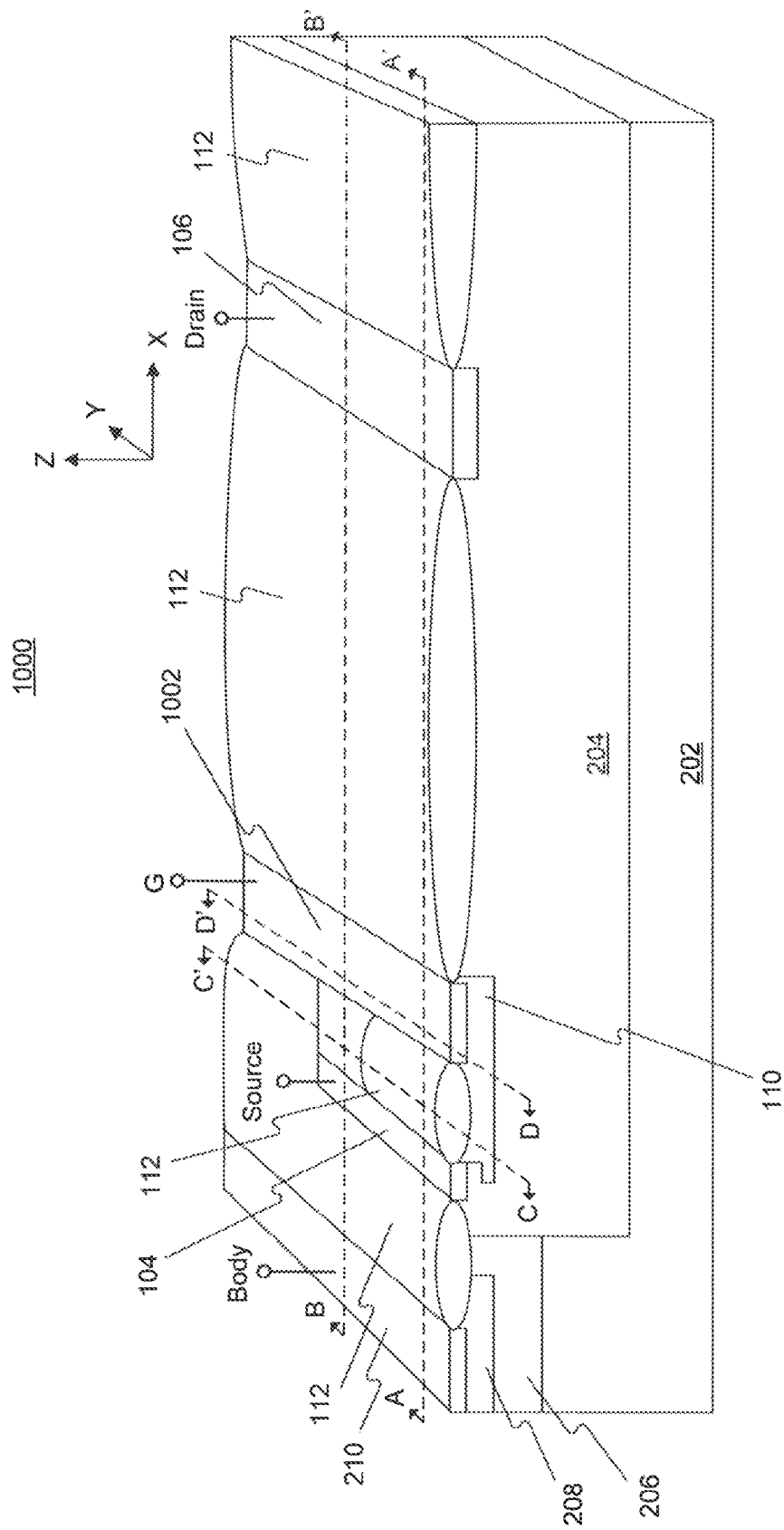
FIGS. 10A-10C schematically show an HV JFET according to an exemplary embodiment.
Figure 10B:
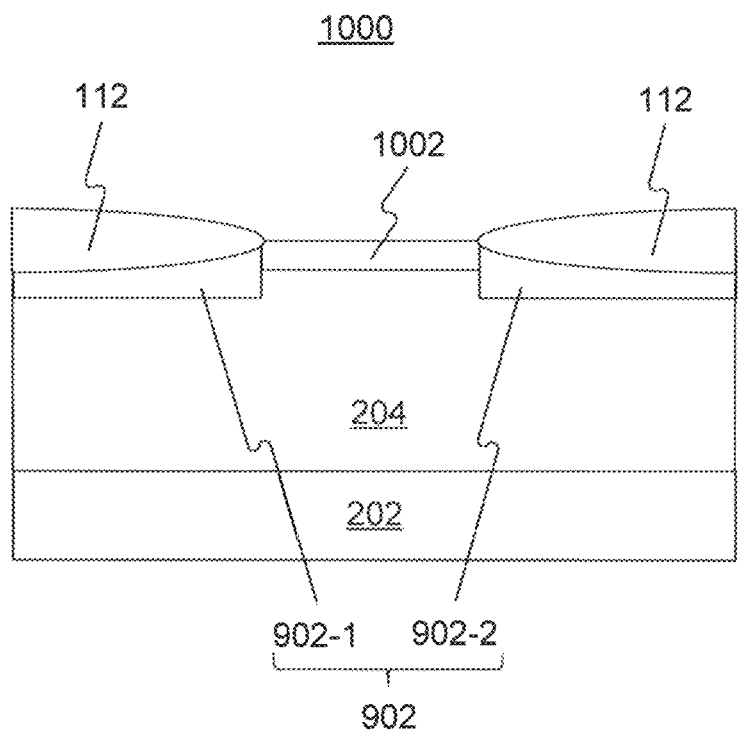
Figure 10C:
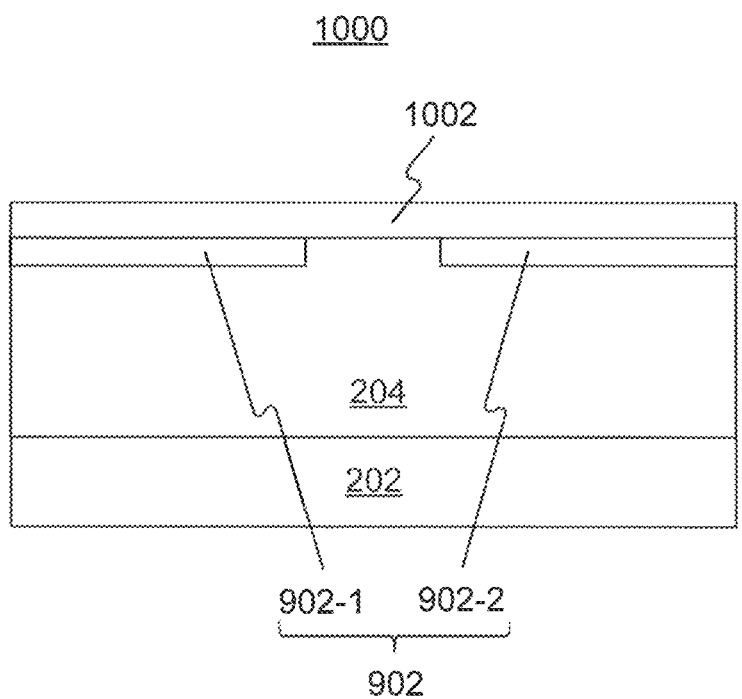

FIGS. 10A-10C schematically show an HV JFET 1000 including another design feature to cause current flow to be spaced from the surface of the device. FIG. 10A is a perspective view of the HV JFET 1000. FIGS. 10B and 10C are cross-sectional views of the HV JFET 1000 along lines C-C' and D-D' in FIG. 10A. The HV JFET 1000 is similar to the HV JFET 900, except that HV JFET 1000 includes a P$^+$ region 1002 that does not have sub-regions but continuously extends above the space between the embedded sub-P-layers 902-1 and 902-2. In the HV JFET 1000, the D-S current is spaced from the surface of the device by the P$^+$ region 1002, and thus the impact of imperfections of the surface of the device is further reduced.

The designs shown in FIGS. 9A-10B can also be used to modify other embodiments of the disclosure, such as the HV JFET's 100, 300, 400, 500, 600, and 700 described above. Therefore, although FIGS. 9A-10B do not show PWells, it is consistent with embodiments of the disclosure that PWells can be added to such designs, such as in the arrangements shown in FIGS. 4C and 4D.

Figure 11:
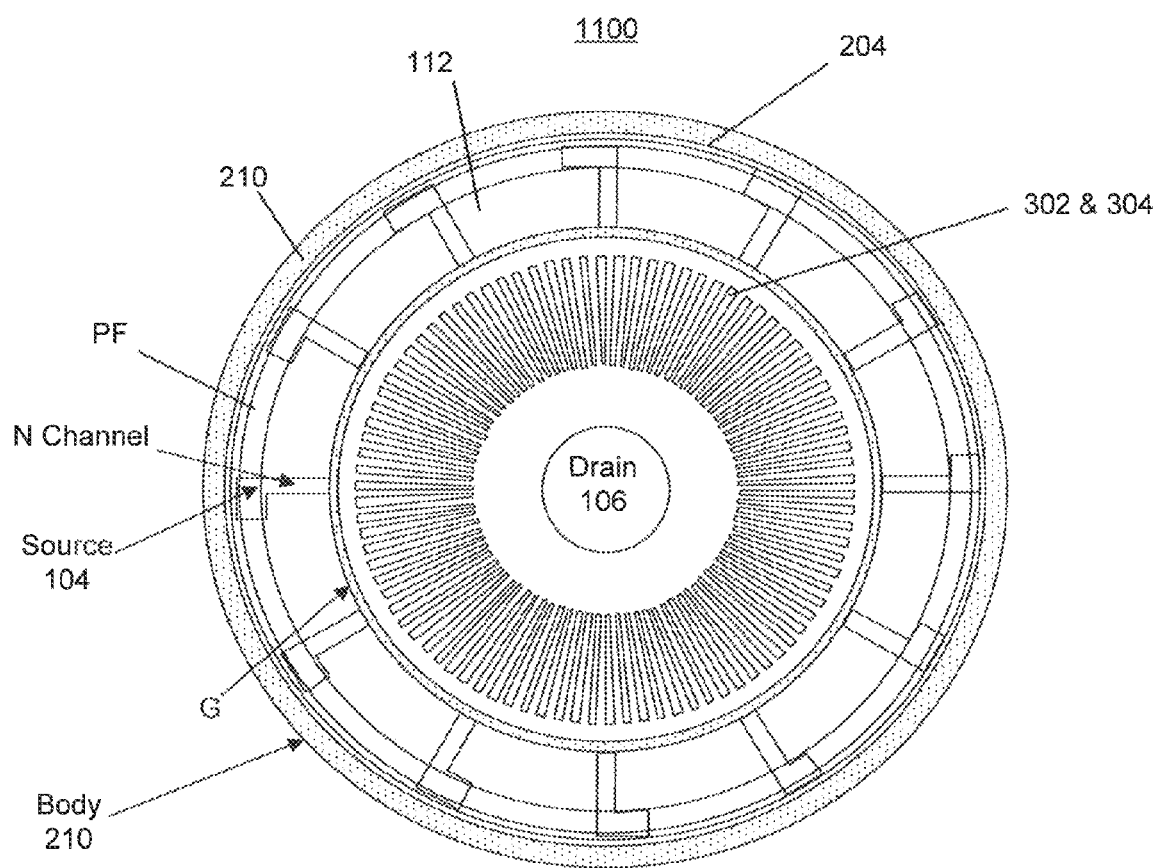
FIG. 11 schematically shows an HV JFET having multiple channels according to an exemplary embodiment.

A saturation current, i.e., the D-S current in the saturation region shown in FIG. 8, can be increased by using a multichannel structure. FIG. 11 is a plan view schematically showing a multi-channel HV JFET 1100 consistent with embodiments of the disclosure. FIG. 11 shows a 12-channel structure, in which the current handling capability is about 12 times that of a structure having one channel. For example, if the saturation D-S current in one channel is 0.5 mA, then in the multi-channel HV JFET 1100, the saturation D-S current is about 6 mA. In FIG. 11, regions labeled with numerals correspond to the regions with the same numerals in the embodiments discussed above.

The HV JFET 1100 includes twelve N Channels, each of which corresponds to one of the channels in the embodiments described above. As shown in FIG. 11, each N Channel includes a narrow portion of one of the step-shaped regions (which is also a portion of the NWell 204), while a wide portion of each step-shaped region corresponds to a subregion of a source region Source (corresponding to the N$^+$ region 104 in the embodiments described above). The HV JFET 1100 further includes a drain region Drain (i.e., the N$^+$ region 106 in the embodiments described above) formed in a center of the HV JFET 1100. Further, the HV JFET 1100 includes a body region Body (corresponding to the P$^+$ region 210 in the embodiments described above) and a gate region G (corresponding to the P$^+$ region 108 or the P$^+$ region 1002 in the embodiments described above). In the HV JFET 1100, P-type field implantation layer PF corresponds to the embedded P-layer 110 or 502 in the embodiments described above. In the example shown in FIG. 11, the P-type field implantation layer PF is formed as a continuous annular region. Moreover, in the plan view of FIG. 11, the N-type layer 304 overlaps the P-top layer 302.

As shown in FIG. 11, in the HV JFET 1100, the source region Source surrounds the gate region G, which in turn surrounds the drain region Drain. In all of the above-described embodiments, as can be seen from the perspective views in FIGS. 1A, 2A, 3A, 4A, 5A, 6A, 7A, and 10A, the N$^+$ region 104 does not extend all the way along the Y direction, but is blocked by the insulating isolation layer 112. Therefore, in the HV JFET 1100, the N$^+$ region 104, i.e., the source region Source, may include a plurality of sub-regions, with adjacent sub-regions separated by an insulating isolation layer. In the HV JFET 1100, the gate region G is formed as a continuous annular region. This corresponds to a structure shown in FIGS. 10A-10C. Alternatively, the gate region G may also include a plurality of sub-regions, with a spacing between each two adjacent sub-regions forming a channel that corresponds to one of the sub-regions of the N$^+$ region 104 (the source region Source). This corresponds to structures shown in FIGS. 1A-9B.

Alternatively, the N$^+$ region 104 (the source region Source) in the HV JFET 1100 may be formed continuously without being divided into sub-regions. The N$^+$ region 104 (the source region Source), whether formed continuously or including sub-regions, may have a ring shape, such as a circle shape, an ellipse shape, or an octagon shape.

Further, the body region Body in FIG. 11 can be omitted, similar to the structure shown in FIGS. 1A-1E.

Figure 12:
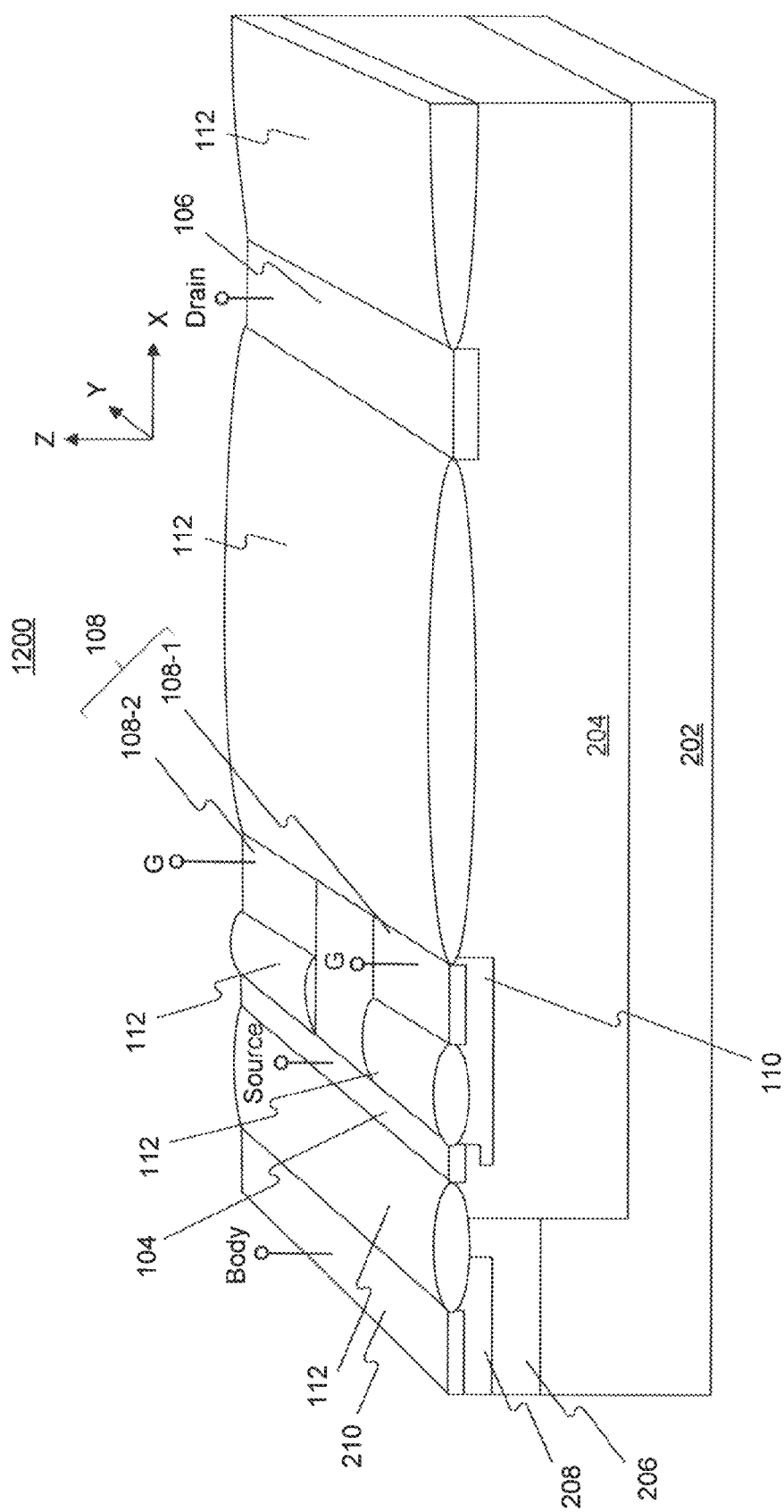
FIG. 12 schematically shows an HV JFET according to an exemplary embodiment.

FIG. 12 is a perspective view schematically showing an HV JFET 1200 having an N$^+$ region 104 continuously extending along Y direction without being blocked by the insulating isolation layer 112, consistent with embodiments of the disclosure. The HV JFET 1200 is similar to the HV JFET 200, except that the N$^+$ region 104 in the HV JFET 1200 extends continuously along the Y direction. The continuous N$^+$ region 104 can be employed in any of the embodiments described above.

The pinch-off voltage of an HV JFET consistent with embodiments of the disclosure can be adjusted by adjusting a distance between the P$^+$ sub-regions 108-1 and 108-2, and/or by adjusting a distance between the embedded sub-P-layers 902-1 and 902-2, when applicable. Typically, increasing the distance between the P$^+$ sub-regions 108-1 and 108-2, or increasing the distance between the embedded sub-P-layers 902-1 and 902-2, increases the pinch-off voltage.

Figure 13:
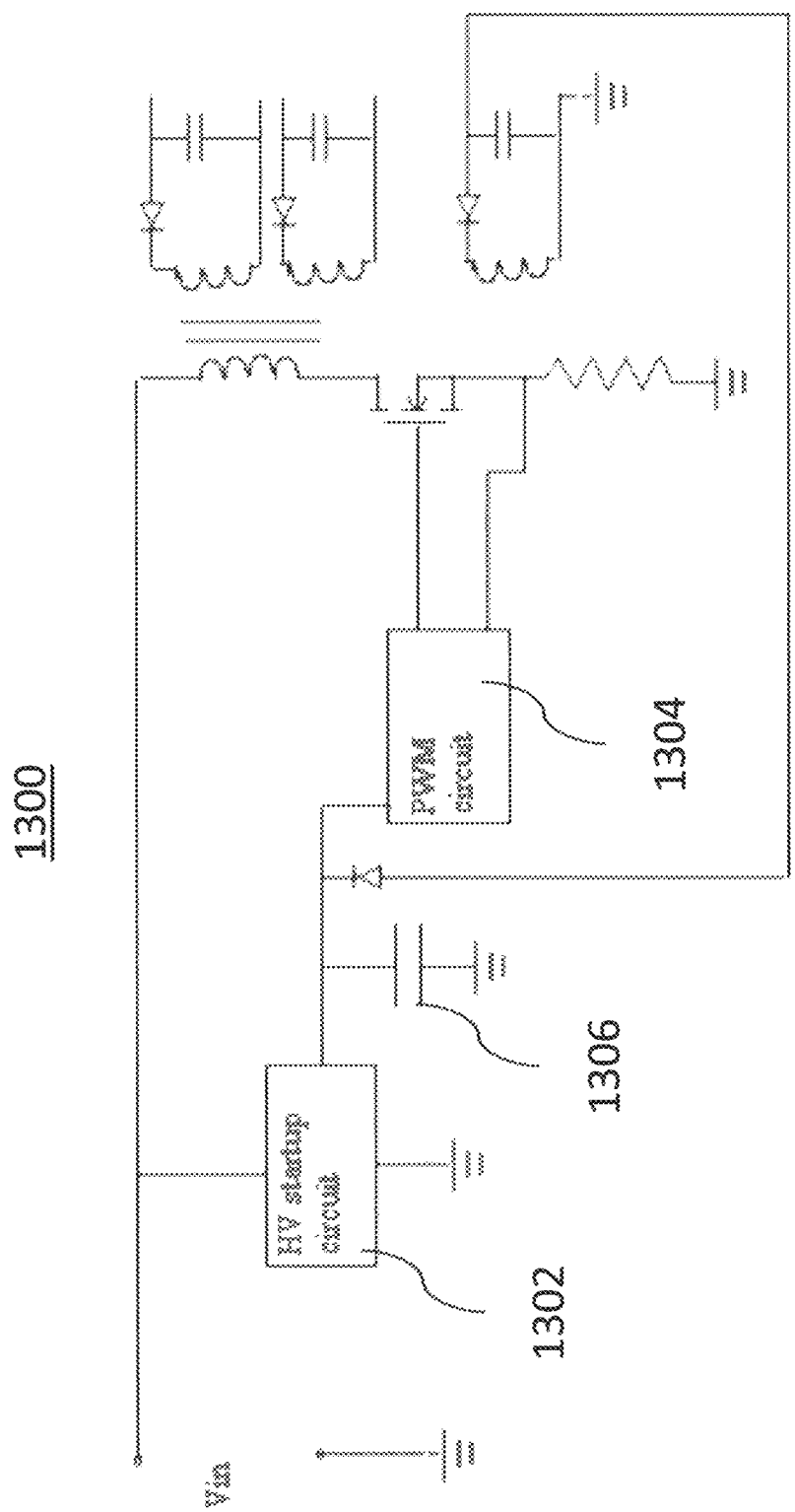
FIG. 13 schematically shows a switch mode power supply according to an exemplary embodiment.

The HV JFET consistent with embodiments of the disclosure can be incorporated in a power management integrated circuit (PMIC) or a switch mode power supply (SMPS). FIG. 13 schematically shows a SMPS 1300 consistent with embodiments of the disclosure. The SMPS 1300 includes a HV start-up circuit 1302, a pulse width modulation (PWM) circuit 1304, and a capacitor 1306. The HV start-up circuit 1302 includes a HV JFET consistent with embodiments of the disclosure, and operates under a wide range of high input voltage (e.g., about 40 V to about 450 V).

As shown in FIG. 13, an output terminal of the HV start-up circuit 1302, an input terminal of the PWM circuit 1304, and one electrode of the capacitor 1306 are coupled to each other. Consistent with embodiments of the disclosure, a drain of the HV JFET consistent with embodiments of the disclosure, e.g., the $N^+$ region 106 (the drain) in the embodiments described above, is connected with the output terminal of the HV start-up circuit 1302. The HV start-up circuit 1302 outputs current for charging the capacitor 1306 and for the start-up operation of the PWM circuit 1304.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device, comprising: a substrate having a first conductivity type;
    a first heavily-doped region formed in the substrate and having the first conductivity type;
    a second heavily-doped region formed in the substrate and having the first conductivity type;
    an embedded layer formed in the substrate and separated from the second heavily-doped region, the embedded layer having a second conductivity type different from the first conductivity type, a portion of the embedded layer being beneath the first heavily-doped region;
    a third heavily-doped region formed in the substrate, between the first and second heavily-doped regions, and contacting the embedded layer, the third heavily-doped region having the second conductivity type;
    a first insulating isolation layer formed on one side of the first, second, and third heavily-doped regions, a second insulating isolation layer formed between the first and third heavily-doped regions, and a third insulating isolation layer formed between the second and third heavily-doped regions;
    wherein the embedded layer as a continuous single layer extends partially beneath the first insulating isolation layer, and completely beneath the first heavily-doped region, the third heavily-doped region and the second insulating isolation layer.

2. The semiconductor device of claim 1, wherein:
    the first heavily-doped region has:
        a first lateral side facing the third heavily-doped region,
        a second lateral side opposite to the third heavily-doped region, and
        a bottom side, and
    the embedded layer completely covers the second lateral side and the bottom side.

3. The semiconductor device of claim 1, wherein:
    the first heavily-doped region, the third heavily-doped region, and the second heavily-doped region are arranged along a first direction and extend along a second direction, and
    the embedded layer extends along the first direction to a point between the second and third heavily-doped regions.

4. The semiconductor device of claim 3, wherein the third heavily-doped region includes a first sub-region and a second sub-region arranged along the second direction and separated from each other.

5. The semiconductor device of claim 4, wherein the embedded layer extends continuously along the second direction beneath a space between the first and second sub-regions.

6. The semiconductor device of claim 1, wherein the first heavily-doped region has a ring shape surrounding the second and third heavily-doped regions.

7. The semiconductor device of claim 1, wherein the first heavily-doped region includes a plurality of sub-regions separated from each other, the plurality of sub-regions of the first heavily-doped region surrounding the second and third heavily-doped regions.

8. The semiconductor device of claim 7, wherein:
    the third heavily-doped region includes a plurality of sub-regions separated from each other,
    the plurality of sub-regions of the third heavily-doped region surround the second heavily-doped region, and
    a spacing between each two adjacent sub-regions of the third heavily-doped region forms a channel, each channel corresponding to one of the plurality of sub-regions of the first heavily-doped region.

9. The semiconductor device of claim 1, wherein:
    the first conductivity type is N type, and
    the second conductivity type is P type.

* * * * *